US012776752B2

(12) United States Patent
McCain et al.

(10) Patent No.: US 12,776,752 B2
(45) Date of Patent: Oct. 27, 2026

(54) RADIO FREQUENCY LOW NOISE AMPLIFIERS

(71) Applicant: Huawei Technologies Co., Ltd., Shenzhen (CN)

(72) Inventors: Terrie McCain, Round Lake, IL (US); William Roeckner, Carpentersville, IL (US); Matthew Miller, Arlington Heights, IL (US)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 552 days.

(21) Appl. No.: 18/359,752

(22) Filed: Jul. 26, 2023

(65) Prior Publication Data

US 2023/0370025 A1 Nov. 16, 2023

Related U.S. Application Data

(63) Continuation of application No. PCT/US2021/015240, filed on Jan. 27, 2021.

(51) Int. Cl.
*H03F 3/195* (2006.01)
*H03F 1/22* (2006.01)

(52) U.S. Cl.
CPC ............ *H03F 3/195* (2013.01); *H03F 1/223* (2013.01); *H03F 2200/294* (2013.01); *H03F 2200/451* (2013.01)

(58) Field of Classification Search
CPC .... H03F 3/195; H03F 1/223; H03F 2200/294; H03F 2200/451; H03F 2200/291; H03F 3/19
USPC ......................... 330/277, 301, 283, 285, 296
See application file for complete search history.

(56) References Cited

U.S. PATENT DOCUMENTS

| | | | | |
|---|---|---|---|---|
| 10,110,166 | B1 * | 10/2018 | Noori | H03B 5/1215 |
| 2001/0033199 | A1 | 10/2001 | Aoki | |
| 2009/0009250 | A1 | 1/2009 | Satoh et al. | |
| 2009/0134949 | A1 | 5/2009 | He | |
| 2009/0251218 | A1 | 10/2009 | Oliveira | |
| 2017/0126180 | A1 | 5/2017 | Bakalski | |
| 2017/0346448 | A1 | 11/2017 | Maxim et al. | |

OTHER PUBLICATIONS

International Search Report and Written Opinion dated Apr. 7, 2021, International Application No. PCT/US2021/015240.

* cited by examiner

*Primary Examiner* — Hieu P Nguyen

(57) ABSTRACT

Methods, systems, and apparatus, including computer programs encoded on computer storage media, for a tunable radio frequency (RF) low noise amplifier (LNA) circuit including an amplifier circuit, where the amplifier circuit is configured to receive an input RF signal from an RF input source and provide an amplified output RF signal, a bias resistor, where a first end of the bias resistor is operatively coupled to an input of the amplifier circuit, a digitally programmable bias circuit operatively coupled to a second end of the bias resistor, where the bias circuit outputs a reference voltage, and a programmable input impedance circuit operatively coupled between the first end of the bias resistor and a ground. The programmable input impedance circuit includes an input transconductor transistor and a programmable inductance network.

20 Claims, 25 Drawing Sheets

RADIO FREQUENCY LOW NOISE AMPLIFIERS

CLAIM OF PRIORITY

This application is a continuation of, and claims priority to, PCT Patent Application No. PCT/US2021/015240, entitled "RADIO FREQUENCY LOW NOISE AMPLIFIERS", filed Jan. 27, 2021, which application is incorporated by reference herein in its entirety.

TECHNICAL FIELD

The present disclosure generally relates to radio frequency low noise amplifiers, particularly as used in radio frequency (RF) receivers and transmitters.

BACKGROUND

Radio frequency (RF) low noise amplifiers are used in modern digital telecommunications to amplify RF signals, e.g., for transmission to base stations and other devices. A RF transceiver integrated circuit (IC) can include multiple RF receiver paths, with each receiver path capable of connecting to multiple input ports.

SUMMARY

The present disclosure generally relates to radio frequency (RF) low noise amplifiers (LNA) for RF receivers and transmitters including programmable gain modes.

More specifically, the subject matter of this disclosure relates to an RF transceiver IC including a programmable LNA having a tunable high gain/narrowband mode and a low gain/wideband mode, where the high gain/narrowband mode or low gain/wideband mode is selectable based in part on a requirement of the RF transceiver IC (e.g., if the RF transceiver IC is being utilized in an RF receiver path including an external LNA, the low gain mode may be selected for the programmable LNA). A programmable input impedance circuit utilizes an inductor-degenerated transconductor to provide a high input impedance for generating low-noise passive gain for the high gain/narrowband mode. In low-gain/wideband mode, the inductor-degenerated transconductor circuit is bypassed where an input impedance can be set using passive or active circuit components.

Moreover, the programmable LNA can include a separately programmable main amplifier circuit and an inductor-degenerated transconductor input impedance circuit, to allow for independent optimization of the two circuits.

In general, one innovative aspect of the subject matter described in this specification can be embodied in a programmable input impedance circuit for a radio frequency (RF) low-noise amplifier (LNA) including a high impedance mode circuit and a low impedance mode circuit. The high impedance mode circuit includes an inductor-degenerated transconductor transistor, an inductor operatively coupled between a source of the inductor-degenerated transconductor transistor and a ground, and a capacitor operatively coupled between a gate of the inductor-degenerated transconductor transistor and the source of the inductor-degenerated transconductor transistor. The low impedance mode circuit includes a shunt resistor operatively coupled between an RF input source and an alternating current (AC) ground. The programmable input impedance circuit is configured to operate in high impedance mode via the high impedance mode circuit or operate in low impedance mode via the low impedance mode circuit.

The foregoing and other embodiments can each optionally include one or more of the features described herein, alone or in combination. In particular, one embodiment includes all the following features in combination. In some embodiments, the low impedance mode circuit further includes a switch, where the programmable input impedance circuit is configured to operate in either the high impedance mode or the low impedance mode by changing a state of the switch.

In some embodiments, the switch is a digital switch, where programming the input impedance circuit includes setting the state of the digital switch to a 0 or a 1.

In some embodiments, the programmable input impedance circuit further includes a second switch operatively coupled between the inductor and ground, where the inductor is disconnected when the second switch is opened.

In some embodiments, low impedance mode includes amplification of multiple receive frequency (RX) bands including multiple frequencies, and/or high impedance mode includes amplification of a proper subset of the multiple RX bands. High impedance mode can include a passive gain for an RF signal input to the RF LNA.

In some embodiments, the shunt resistor is part of an active feedback circuit including at least one transistor, where an impedance looking into the structure is an inverse of the sum of transconductance of the at least one transistor. The at least one transistor can include two transistors including a p-channel metal-oxide-semiconductor (pMOS) transistor and an n-channel metal-oxide-semiconductor (nMOS) transistor.

In general, another innovative aspect of the subject matter described in this specification can be embodied in a programmable input impedance circuit for an RF LNA including a high impedance mode circuit and a low impedance mode circuit. The high impedance mode circuit includes an inductor-degenerated transconductor transistor, an inductor operatively coupled between a source of the inductor-degenerated transconductor transistor and a ground, a first switch operatively coupled between the inductor and the ground, a capacitor operatively coupled between a gate of the inductor-degenerated transconductor transistor and the source of the inductor-degenerated transconductor transistor, The high impedance mode circuit further includes a first biasing circuit operatively coupled to the source and a drain of the inductor-degenerated transconductor transistor via a second switch and a third switch, and biased to a supply voltage, where the inductor-degenerated transconductor transistor source and drain is biased to the supply voltage, and a second biasing circuit operatively coupled to the gate of the inductor-degenerated transconductor transistor via a fourth switch, and biased to ground, where the inductor-degenerated transconductor transistor gate is biased to ground.

The foregoing and other embodiments can each optionally include one or more of the features described herein, alone or in combination. In particular, one embodiment includes all the following features in combination. In some embodiments, the programmable input impedance circuit is configured in the high impedance mode by closing the first switch and opening the second, third, fourth, switches and opening a fifth switch.

In some embodiments, opening the first switch increases a parasitic LC resonant frequency of the high impedance mode circuit.

In general, another innovative aspect of the subject matter described in this specification can be embodied in methods for configuring an RF receiver including receiving a gain requirement for an RF low noise amplifier (LNA) of the RF receiver, and selecting, based on the gain requirement, a high gain mode or a low gain mode for a programmable input impedance circuit of the RF LNA, wherein selecting the low gain mode comprises selecting a low gain mode circuit of the programmable input impedance circuit and selecting the high gain mode includes selecting a high gain mode circuit of the programmable input impedance circuit. The low gain mode circuit includes a shunt resistor operatively coupled between an RF input source and the alternating current (AC) ground, and where the high gain mode circuit includes an inductor-degenerated transconductor transistor, an inductor operatively coupled between a source of the inductor-degenerated transconductor transistor and a ground, and a capacitor operatively coupled between a gate of the inductor-degenerated transconductor transistor and the source of the inductor-degenerated transconductor transistor.

The foregoing and other embodiments can each optionally include one or more of the features described herein, alone or in combination. In particular, one embodiment includes all the following features in combination. In some embodiments, the RF receiver further includes a switch, where selecting the low gain mode circuit includes selecting a first position of the switch and selecting the high gain mode circuit includes selecting a second position of the switch.

In some embodiments, selecting the low gain mode further includes disabling the high gain mode circuit by opening a second switch operatively coupled between the inductor and the ground and closing a third and fourth switches operatively coupled between a respective source and a drain of the transistor and a supply voltage.

In some embodiments, selecting the first position or the second position of the switch includes selecting, by a control circuit, either the first position or the second position of the switch.

In some embodiments, the control circuit includes a programmable microcontroller.

In some embodiments, receiving the gain requirement for the RF LNA of the RF receiver includes determining, by the RF receiver, that an RF input signal is at least at a threshold amount of signal integrity, and in response, selecting the low gain mode.

In some embodiments, receiving the gain requirement for the RF LNA of the RF receiver includes determining, by the RF receiver, that a wireless device including the RF receiver is within a threshold distance to a base station including an RF source of the RF input signal.

In general, another innovative aspect of the subject matter described in this specification can be embodied in methods for an RF receiver including a dual-mode LNA including receiving, by the RF receiver, an input RF signal. The RF receiver is configured to a wideband mode including configuring the dual-mode LNA to a wideband mode, where the wideband mode includes operation over multiple receive frequency (RX) bands including a multiple frequencies, and scanning the multiple frequencies to detect a transmitted frequency of the input RF signal. The RF receiver is configured to narrowband mode including configuring the dual-mode LNA to a narrowband mode, where the narrow band mode includes operation over a proper subset of the RX bands including a proper subset of the multiple frequencies, and tuning the RF receiver to the transmitted frequency.

The foregoing and other embodiments can each optionally include one or more of the features described herein, alone or in combination. In particular, one embodiment includes all the following features in combination. In some embodiments, scanning the multiple frequencies for the transmitted frequency further includes configuring a matching network of the RF receiver to a wideband mode. Configuring the matching network to the wideband mode can include bypassing the matching network.

In some embodiments, configuring the matching network to the wideband mode includes selecting a wideband circuit of the matching network, where the wideband circuit includes a series inductor.

In some embodiments, configuring the RF receiver to narrowband mode further includes configuring the matching network to a narrowband mode. Configuring the matching network to narrowband mode can include selecting a narrowband circuit of the matching network, where the narrowband circuit includes a shunt inductor and a series inductor.

In some embodiments, the programmable input impedance circuit includes a low gain mode circuit and a high gain mode circuit, where configuring the programmable input impedance circuit to the wideband mode includes selecting the low gain mode circuit, and where configuring the programmable input impedance in the narrowband mode includes selecting the high gain mode circuit.

In some embodiments, the high gain mode circuit includes an inductor-degenerated transconductor transistor, an inductor operatively coupled between a source of the inductor-degenerated transconductor transistor and a ground, and a capacitor operatively coupled between a gate of the inductor-degenerated transconductor transistor and the source of the inductor-degenerated transconductor transistor.

In some embodiments, the low gain mode circuit includes a shunt resistor operatively coupled between an RF input source and an alternating current (AC) ground.

In some embodiments, the methods further include a control circuit that is operably connected to the RF LNA and is configured to provide instructions to configure the programmable input impedance circuit to the wideband mode or the narrowband mode.

In some embodiments, the RF receiver is configured to operate over multiple RX bands including the multiple frequencies in wideband mode.

In general, another innovative aspect of the subject matter described in this specification can be embodied in a device including at least one processor, an antenna, and communication circuitry coupled to the at least one processor and the antenna, where the communication circuitry includes an RF receiver configured to perform the methods above.

In general, another innovative aspect of the subject matter described in this specification can be embodied in a tunable RF receiver including an antenna, a matching network coupled to the antenna, a tunable LNA coupled to the matching network, a mixer coupled to the tunable LNA, and a baseband filter coupled to the mixer. The tunable receiver is configured to perform the actions including receiving, by the RF receiver, an input RF signal. The RF receiver is configured to a wideband mode including configuring the dual-mode LNA to a wideband mode, where the wideband mode includes operation over multiple receive frequency (RX) bands including a multiple frequencies, and scanning the multiple frequencies to detect a transmitted frequency of the input RF signal. The RF receiver is configured to narrowband mode including configuring the dual-mode LNA to a narrowband mode, where the narrow band mode includes operation over a proper subset of the RX bands including a proper subset of the multiple frequencies, and tuning the RF receiver to the transmitted frequency.

The foregoing and other embodiments can each optionally include one or more of the features described herein, alone or in combination. In particular, one embodiment includes all the following features in combination. In some embodiments, the RF receiver further includes a surface acoustic wave (SAW) filter or a duplexer coupled between the antenna and matching network, wherein the matching network is configured to match an output impedance of the SAW or duplexer to the input impedance of the LNA.

In some embodiments, the matching network includes a narrowband mode circuit including a shunt inductor and a series inductor, and a wideband mode circuit including the series inductor, where the shunt inductor is disconnected when the RF receiver is configured to wideband mode.

In some embodiments, the matching network further includes a wideband mode bypass switch, wherein the wideband mode bypass switch is open when the RF receiver is configured to narrowband mode.

In some embodiments, the RF receiver further includes a control circuit, where the control circuit is operably connected to the RF LNA and configured to provide instructions to configure the RF receiver to wideband mode or configure the RF receiver to narrowband mode.

In general, another innovative aspect of the subject matter described in this specification can be embodied in an RF LNA circuit configured to receive an input RF signal from an RF input source and provide an amplified output RF signal. The RF LNA circuit includes an amplifier circuit, where the amplifier circuit is configured to receive the input RF signal and provide the amplified output RF signal, and an inductor-degenerated transconductor input impedance circuit that is separate from the amplifier circuit and that is operatively coupled to the input of the amplifier circuit.

The foregoing and other embodiments can each optionally include one or more of the features described herein, alone or in combination. In particular, one embodiment includes all the following features in combination. In some embodiments, the RF LNA further includes a matching network operatively coupled between the RF input source and an input of the RF LNA.

In some embodiments, the matching network includes a single series component.

In some embodiments, the configuration of the inductor-degenerated transconductor impedance circuit includes configuring a transconductance and an inductance of the inductor-degenerated transconductor impedance circuit to achieve a targeted input impedance, without affecting the operation of the amplifier circuit.

In some embodiments, the inductor-degenerated transconductor input impedance circuit includes an inductor-degenerated transconductor transistor, an inductor operatively coupled between a source of the inductor-degenerated transconductor transistor and a ground, and a capacitor operatively coupled between a gate of the inductor-degenerated transconductor transistor and the source of the inductor-degenerated transconductor transistor. The inductor-degenerated transconductor input impedance circuit can be configured to generate an equivalent parallel resistance greater than the source resistance of the RF input source.

In some embodiments, the inductor-degenerated transconductor transistor, inductor, and capacitor are each tunable.

In some embodiments, the programmable input impedance circuit further includes a low gain impedance circuit including a shunt resistor operatively coupled between an RF input source and an alternating current (AC) ground.

In some embodiments, the programmable input impedance further includes a switch operatively coupled between the low gain impedance circuit and ground, where selecting the low gain mode circuit includes selecting a first position of the switch and selecting the inductor-degenerated transconductor input impedance circuit comprises selecting a second position of the switch.

In some embodiments, the RF LNA further includes a control circuit, where the control circuit is operably connected to the RF LNA and configured to provide instructions to select the first position or the second position of the switch.

In some embodiments, configuring the amplifier circuit includes configuring one or more of i) a power dissipation of the amplifier circuit, ii) an automated gain control of the amplifier circuit, iii) an output impedance of the amplifier circuit, or iv) a single-ended to differential conversion by the amplifier circuit.

In general, another innovative aspect of the subject matter described in this specification can be embodied in a device including at least one processor, an antenna, and communication circuitry coupled to the at least one processor and the antenna, where communication circuitry includes the RF receiver including the RF LNA described above.

In general, another innovative aspect of the subject matter described in this specification can be embodied in a tunable RF LNA circuit including an amplifier circuit, where the amplifier circuit is configured to receive an input RF signal from an RF input source and provide an amplified output RF signal, a bias resistor, where a first end of the bias resistor is operatively coupled to an input of the amplifier circuit, a digitally programmable bias circuit operatively coupled to a second end of the bias resistor, where the bias circuit outputs a reference voltage, and a programmable input impedance circuit operatively coupled between the first end of the bias resistor and a ground. The programmable input impedance circuit includes an input transconductor transistor, where a gate-to-source capacitance between a gate and a source of the input transconductor transistor is programmable by a programmable capacitor network comprising at least one capacitor coupled to a first switch, where a first side of the programmable capacitor network is coupled to the gate of the input transconductor transistor and second side of the programmable capacitor network is coupled to the source of the input transconductor transistor, and a programmable inductance network including at least a first inductor coupled to a second switch, where a first end of the programmable inductance network is coupled to the source of the input transconductor transistor and a second end of the programmable inductance network is coupled to ground. The reference voltage of the digitally programmable bias circuit is coupled to the gate of the input transconductance transistor, where varying the reference voltage generates a variable programmable transconductance of the input transconductor transistor.

The foregoing and other embodiments can each optionally include one or more of the features described herein, alone or in combination. In particular, one embodiment includes all the following features in combination. In some embodiments, a degeneration inductance of the programmable inductance network is digitally programmable using the second switch, operatively connected to the at least first inductor.

In some embodiments, the programmable inductance network further includes a third switch and a second inductor and a third inductor, where the second inductor is coupled to the second switch at a first tap point, and the third inductor is coupled to the third switch at a second tap point. The first inductor, second inductor, and third inductor are connected in series, where the first tap point is between the f inductor and the second inductor and the second tap point is between the second inductor and the third inductor.

In some embodiments, the programmable inductance network further includes a fourth switch, where the fourth switch is coupled between the third inductor and ground.

In some embodiments, a capacitance of the a programmable capacitor network is digitally programmable by actuating the first switch.

In some embodiments, the RF receiver further includes a control circuit configured to provide control signals to the first switch and the second switch, where the control signals actuate a respective switch. The control circuit can be further configured to provide control signals to the digitally programmable bias circuit to adjust a value of the reference voltage. The control circuit can be further configured to provide control signals to adjust the gate-to-source capacitance between the gate and the source of the input transconductor transistor. The control circuit can be further configured to provide control signals to adjust the transconductance of the input transconductor transistor.

In some embodiments, the RF receiver is tunable over a range of RX bands including multiple frequencies, where an effective parallel resistance of the RF receiver is substantially constant over the range of RX bands by adjusting the given gate-to-source capacitance, the transconductance of the input transconductor transistor and the degeneration inductance of the programmable inductance network. In one example, the effective parallel resistance of the RF receiver varies less than 20% from a target parallel resistance over the range of RX bands.

In some embodiments, the RF receiver is tunable over a range of RX bands including multiple frequencies, where a gain of the RF receiver is substantially constant over the range of RX bands by adjusting the given gate-to-source capacitance, the transconductance of the input transconductor transistor and the degeneration inductance of the programmable inductance network. In one example, the gain of the RF receiver varies less than 0.5 dB from a target gain over the range of RX bands.

In general, another innovative aspect of the subject matter described in this specification can be embodied in methods for tuning a tunable RF LNA circuit including an amplifier circuit configured to receive an input RF signal from an RF input source and provide an amplified output RF signal, a bias resistor comprising a first end of the bias resistor operatively coupled to an input of the amplifier circuit, a digitally programmable bias circuit operatively coupled to a second end of the bias resistor, and a programmable input impedance circuit operatively coupled between the first end of the bias resistor and ground. The methods include, for a target frequency of multiple frequencies of the RF LNA, selecting a degeneration inductance, a gate-to-source capacitance, and a transconductance of an input transconductor transistor to yield a target parallel resistance value. Selecting the degeneration inductance includes selecting a degeneration inductance value of a programmable inductance network of the programmable input impedance circuit including at least a first inductor coupled to a second switch. Selecting the inductance includes actuating at least the second switch. Selecting the transconductance includes selecting a reference current of the programmable bias circuit, where the reference current of the digitally programmable bias circuit is mirrored to the input transconductance transistor, and where selecting the gate-to-source capacitance includes selecting a gate-to-source capacitance value of a programmable capacitor network of the programmable input impedance circuit including at least a first capacitor coupled to a first switch, where selecting the capacitance includes actuating at least the first switch.

The foregoing and other embodiments can each optionally include one or more of the features described herein, alone or in combination. In particular, one embodiment includes all the following features in combination. In some embodiments, an operating frequency of multiple operating frequencies of the LNA is varied by selecting a capacitance value of the programmable capacitor network.

The subject matter described in this specification can be implemented in particular embodiments to realize one or more of the following advantages. A transceiver IC including a dual-mode RF LNA, as described in this specification, can be utilized in end products that include external LNA as well as products that exclude external LNA, e.g., high-end mobile products and low-end mobile products. Furthermore, a mobile product may include input ports in which an external LNA is required, while other input ports in the same mobile product do not. Utilizing a common transceiver IC for both high-end and low-end products requires the front-end of the transceiver receive path to have programmable gain modes, e.g., high gain mode for paths with no external LNA, and low gain mode for paths with an external LNA. In this manner, a transceiver IC including programmable gain modes can be configured for the requirements of multiple end-products without needing to be redesigned.

In some embodiments, a receiver path including a single receiver port capable of switching between a wideband mode to scan for a transmitted frequency and a narrowband mode for amplifying the particular detected transmitted frequency can reduce a number of input ports, which in turn results in cost and chip size reductions. Moreover, such a receiver path allows the transceiver IC to operate over a broad range of frequencies, all without impacting a gain or noise figure (NF) advantage of the transceiver IC.

In some embodiments, a RF receiver is operable over a wide frequency range while maintaining a relatively constant equivalent parallel input resistance (Rp) such that a small receiver line-up gain variation can be enabled while providing a simple way to achieve multi-band performance and realize the benefits of a narrow band LNA design. These benefits can include high passive gain, lower power dissipation, and low receiver noise figure. Moreover, the RF receiver configured in this manner can also enable reduction of the number of unique receive frequency input ports, leading to smaller die size and reduced cost.

In some embodiments, a main amplifier circuit can be separated from a programmable input impedance circuit in an RF LNA, which allows independent optimization of both circuits. This can allow an inductor-degenerated transconductor circuit included in the programmable input impedance circuit to be implemented with large inductance and large transconductance values, which can yield a real part input impedance Rs that is closely matched to a low impedance value of a signal source of the RF receiver path, while not impacting the various design requirements of the main amplifier, e.g. low current, programmable AGC, high output impedance, single-ended to differential conversion, etc.

The details of one or more embodiments of the subject matter of this specification are set forth in the accompanying drawings and the description below. Other features, aspects, and advantages of the subject matter will become apparent from the description, the drawings, and the claims.

DETAILED DESCRIPTION

Figure 1:
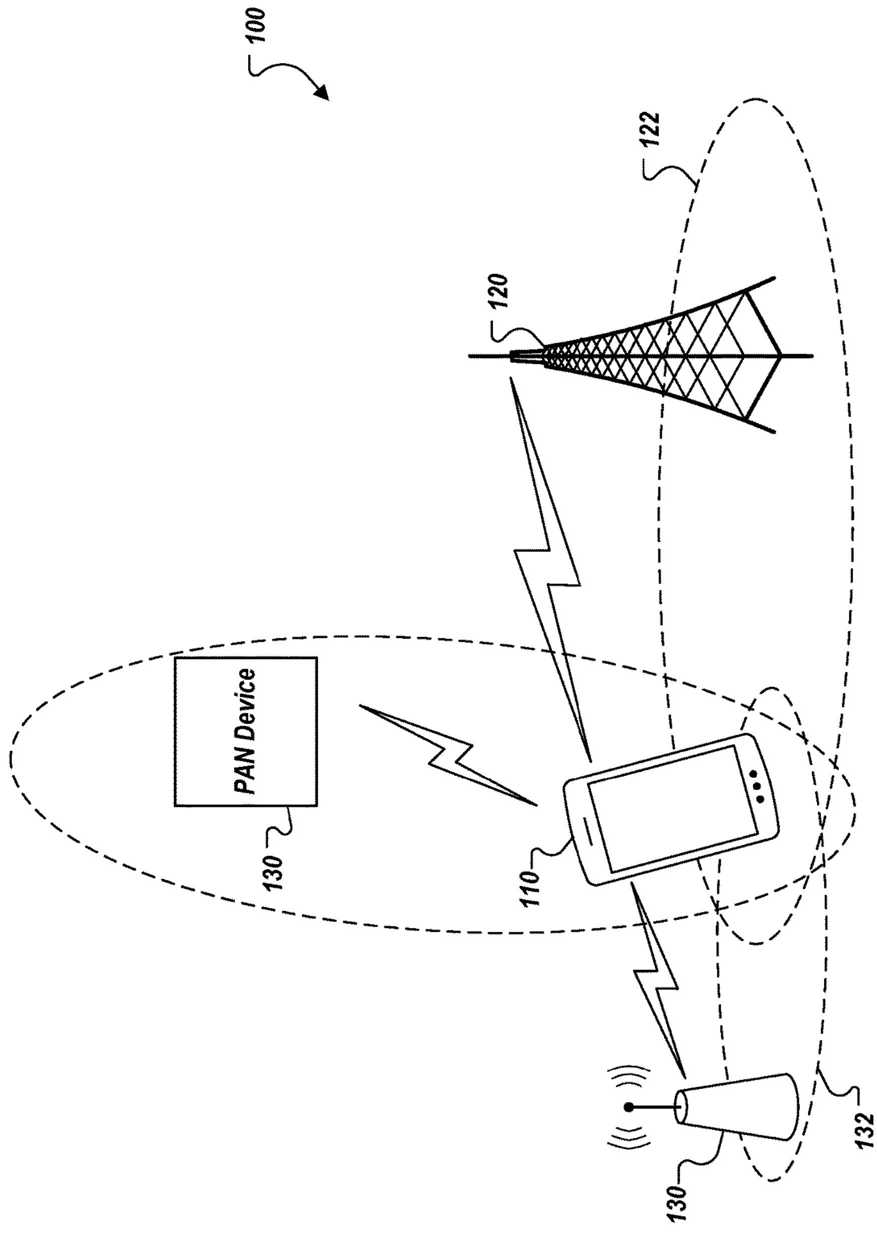
FIG. 1 is a block diagram of an example wireless communication system.

FIG. 1 is a block diagram of an example wireless communication system 100 including a wireless device 110 capable of communicating with one or more wireless communication networks. The one or more wireless communication networks with which the wireless device 110 is capable of communicating can include but is not limited to one or more cellular or wireless wide area networks (WWANs), one or more wireless local area networks (WLANs), one or more wireless personal area networks (WPANs), or a combination thereof.

In the example of FIG. 1, the wireless device 110 is communicating with at least one WWAN by way of at least one base station 120 and at least one WLAN by way of at least one access point 130. The at least one base station 120 can support bi-directional communication with wireless devices that are within its corresponding area of coverage 122. Similarly, the at least one access point 130 can support bi-directional communication with wireless devices that are within its corresponding area of coverage 132.

In some implementations, the at least one WWAN with which the at least one base station 120 is associated can be a fifth generation (5G) network among other generations and types of networks. In these implementations, the at least one base station 120 can be a 5G base station that employs orthogonal frequency-division multiplexing (OFDM) and/or non-OFDM and a transmission time interval (TTI) shorter than 1 ms (e.g. 100 or 200 microseconds), to communicate with wireless devices, such as wireless device 110. For example, the at least one base station 120 can take the form of one of several devices, such as a base transceiver station (BTS), a Node-B (NodeB), an evolved NodeB (eNB), a next (fifth) generation (5G) NodeB (gNB), a Home NodeB, a Home eNodeB, a site controller, an access point, or a wireless router, or a server, router, switch, or other processing entity with a wired or wireless network. In addition, and as shown in FIG. 1, wireless device 110 is configured to communicate with one or more personal area network (PAN) devices/systems 130 (e.g., Bluetooth® or radio frequency identification (RFID) systems and devices) over one or more WPANs.

System 100 can use multiple channel access functionality, including for example schemes in which the at least one base station 120 and the wireless device 110 are configured to implement the Long Term Evolution wireless communication standard (LTE), LTE Advanced (LTE-A), and/or LTE Multimedia Broadcast Multicast Service (MBMS). In other implementations, the at least one base stations 120 and wireless device 110 are configured to implement UMTS, HSPA, or HSPA+ standards and protocols. Of course, other multiple access schemes and wireless protocols can be utilized. In some examples, one or more such access schemes and wireless protocols can correspond to standards that impose RF power amplifier linearity requirements.

To communicate with one or both of the at least one base station 120 and the access point 130, the wireless device 110 can include singular or multiple transmitter and receiver components similar or equivalent to one or more of those described in further detail below with reference to FIG. 2 to support multiple communications with different types of access points, base stations, and other wireless communication devices.

Although FIG. 1 illustrates one example of a communication system, various changes can be made to FIG. 1. For example, the communication system 100 could include any number of wireless devices, base stations, access points, networks, or other components in any suitable configuration.

Figure 2:
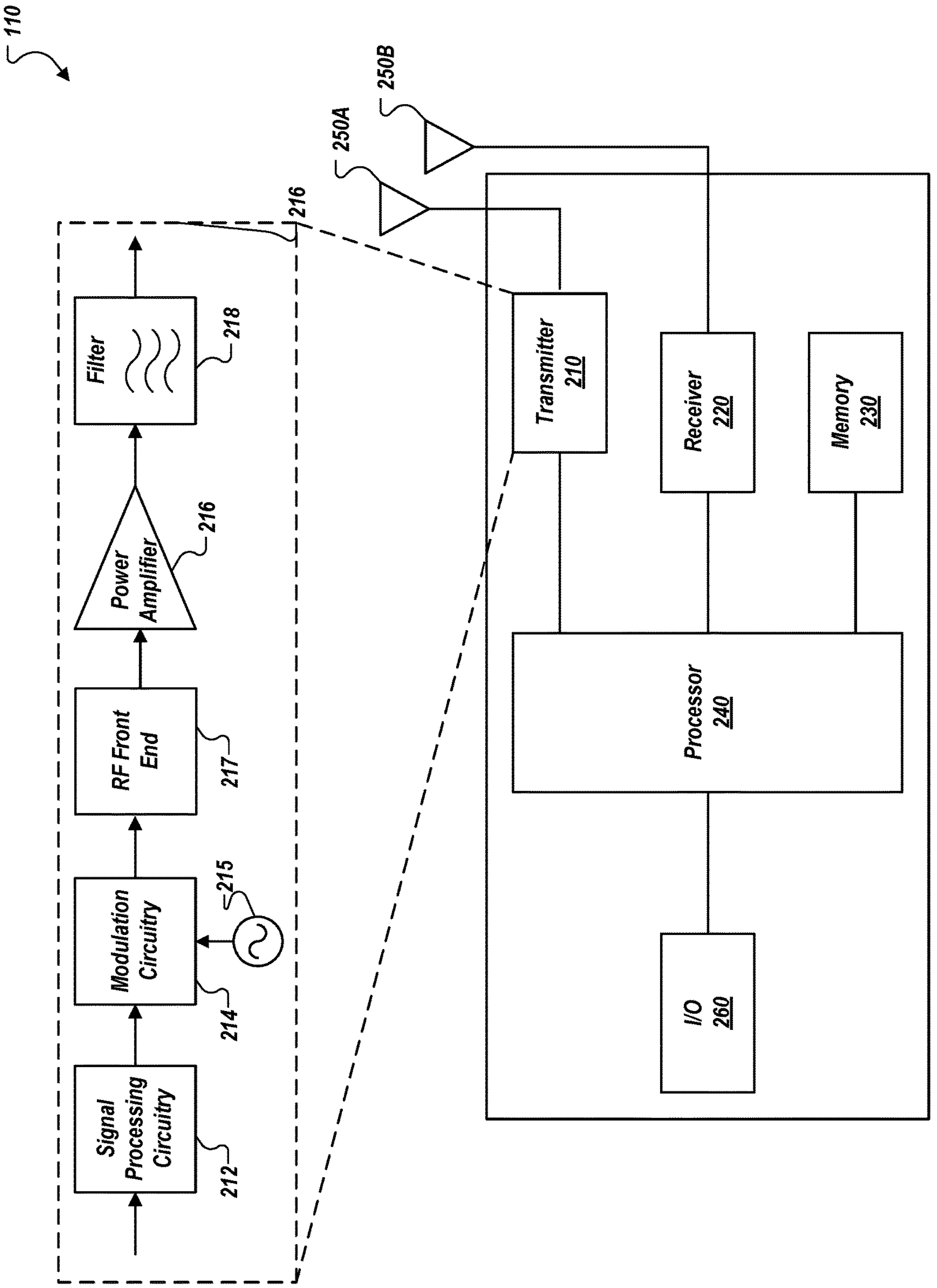
FIG. 2 is a block diagram of example details of a wireless device that may implement the methods and teachings according to this disclosure.

FIG. 2 is a block diagram that illustrates example details of the wireless device 110 that can implement the methods and teachings according to this disclosure. The wireless device 110 can, for example, be a mobile telephone, but can be other devices in further examples such as a desktop computer, laptop computer, tablet, hand-held computing device, automobile computing device and/or other computing devices. As shown in the figure, the wireless device 110 is shown as including at least one transmitter 210, at least one receiver 220, memory 230, at least one processor 240, and at least one input/output device 260. Here, only one transmitter and only one receiver are shown, but in many embodiments, multiple transmitters and receivers are included to support multiple communications of different types at the same time. Each transmitter may employ the innovations of the present disclosure.

The processor 240 can implement various processing operations of the wireless device 110. For example, the processor 240 can perform signal coding, data processing, power control, input/output processing, or any other functionality enabling the wireless device 110 to operate in the system 100 (FIG. 1). The processor 240 can include any suitable processing or computing device configured to perform one or more operations. For example, the processor 240 can include a microprocessor, microcontroller, digital signal processor, field programmable gate array, or application specific integrated circuit, or a combination of these devices.

The transmitter 210 is configured to modulate data or other content, filter and amplify outgoing radio frequency (RF) signals for transmission by at least one antenna 250A. The transmitter 210 can also be configured to amplify, filter and upconvert baseband or intermediate frequency signals to radio frequency (RF) signals before such signals are provided to the antenna 250A for transmission. The transmitter 210 can include any suitable structure for generating RF signals for wireless transmission. Additional aspects of the transmitter 210 are described in further detail below with reference to components 212-218 as depicted in FIG. 2.

The receiver 220 can be configured to demodulate data or other content received in ingoing RF signals by at least one antenna 250B. The receiver 220 can also be configured to amplify, filter and frequency down convert RF signals received via the antenna 250B either to intermediate frequency (IF) or baseband frequency signals prior to conversion to digital form and processing. The receiver 220 can include any suitable structure for processing signals received wirelessly.

Each of the antennas 250A and 250B can include any suitable structure for transmitting and/or receiving wireless RF signals. In some implementations, the antennas 250A and 250B can be implemented by way of a single antenna that can be used for both transmitting and receiving RF signals.

It is appreciated that one or multiple transmitters 210 could be used in the wireless device 110, one or multiple receivers 220 could be used in the wireless device 110, and one or multiple antennas 250 could be used in the wireless device 110. For example, in one embodiment, device 110 includes at least three transmitters 210 and receivers 220 for communicating via a personal area network such as Bluetooth®, a WiFi networks such as IEEE 802.11 based networks, and a cellular network. Each one of these protocol transceivers (transmitter 210 and receiver 220) may employ the concepts of the present disclosure. Although shown as separate blocks or components, at least one transmitter 210 and at least one receiver 220 could be combined into a transceiver. Accordingly, rather than showing a separate block for the transmitter 210 and a separate block for the receiver 220 in FIG. 2, a single block for a transceiver could have been shown.

The wireless device 110 further includes one or more input/output devices 260. The input/output devices 260 facilitate interaction with a user. Each input/output device 260 includes any suitable structure for providing information to or receiving information from a user, such as a speaker, microphone, keypad, keyboard, display, or touch screen.

In addition, the wireless device 110 includes at least one memory 230. The memory 230 stores instructions and data used, generated, or collected by the wireless device 110. For example, the memory 230 could store software or firmware instructions executed by the processor(s) 240 and data used to reduce or eliminate interference in incoming signals. Each memory 230 includes any suitable volatile and/or non-volatile storage and retrieval device(s). Any suitable type of memory may be used, such as random access memory (RAM), read only memory (ROM), hard disk, optical disc, subscriber identity module (SIM) card, memory stick, secure digital (SD) memory card, and the like.

In some implementations, the transmitter 210 can include signal processing circuitry 212, modulation circuitry 214, an RF Front End 217, a power amplifier 216, and at least one filter 218. The signal processing circuitry 212 may include one or more circuits that are configured to process signals received as input (e.g. from processor 240). For example, the signal processing circuitry 212 may include a digital-to-analog converter (D/A), which converts a digital input (e.g. from processor 240) into an analog signal, which is then provided to a low pass filter, which filters the analog signal and provides the filtered analog signal to the modulation circuitry 214. The modulation circuitry 214, in addition to receiving the filtered analog signal from the signal processing circuitry 212, also receives a signal from a local oscillator 215 and modulates or adjusts the frequency of the signal, e.g., from a first frequency to a second frequency that is higher than the first frequency. For instance, the modulation circuitry 214 may include a mixer that frequency up-converts the filtered analog signal from a relatively low frequency (e.g. baseband frequency, or an intermediate frequency (IF) that is offset from the baseband frequency) to a relatively high frequency RF signal. Thus, a signal from the local oscillator 215 is used as a carrier signal in transmitter 210. Moreover, as shown in FIG. 2, transmitter 210 includes an RF front end 217, which includes amplification and filtering circuits that filter and amplify the RF signal before providing the RF signal to the power amplifier 216.

The RF signal from the RF front end 217 is then amplified by the power amplifier 216 and filtered by the at least one filter 218 before being provided as output of the transmitter 210 to the at least one antenna 250A for wireless transmission. Although FIG. 2 shows the filter 218 as downstream from the power amplifier 216, in some implementations, the filter 218 can be upstream from the power amplifier 216 in which case the RF signal from the RF front end 217 is first filtered by the at least one filter 218 and then amplified by the power amplifier 216 before being provided as output of the transmitter 210 to the at least one antenna 250A for wireless transmission.

Figure 3A:
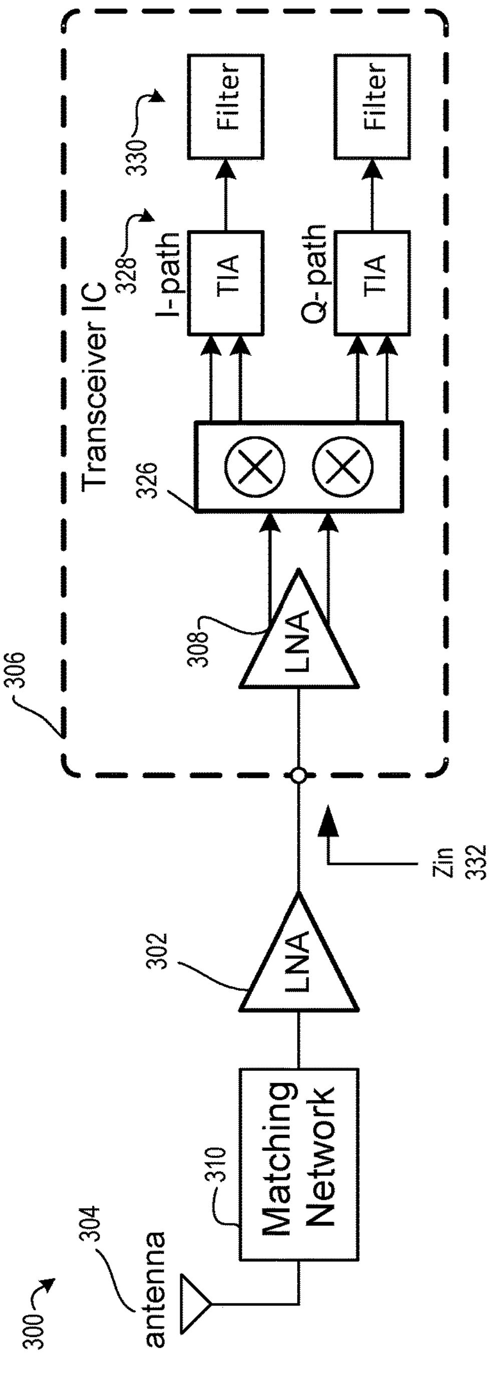
FIGS. 3A-C are block diagrams of example receiver paths including matching networks and transceiver integrated circuits (IC).
Figure 3B:
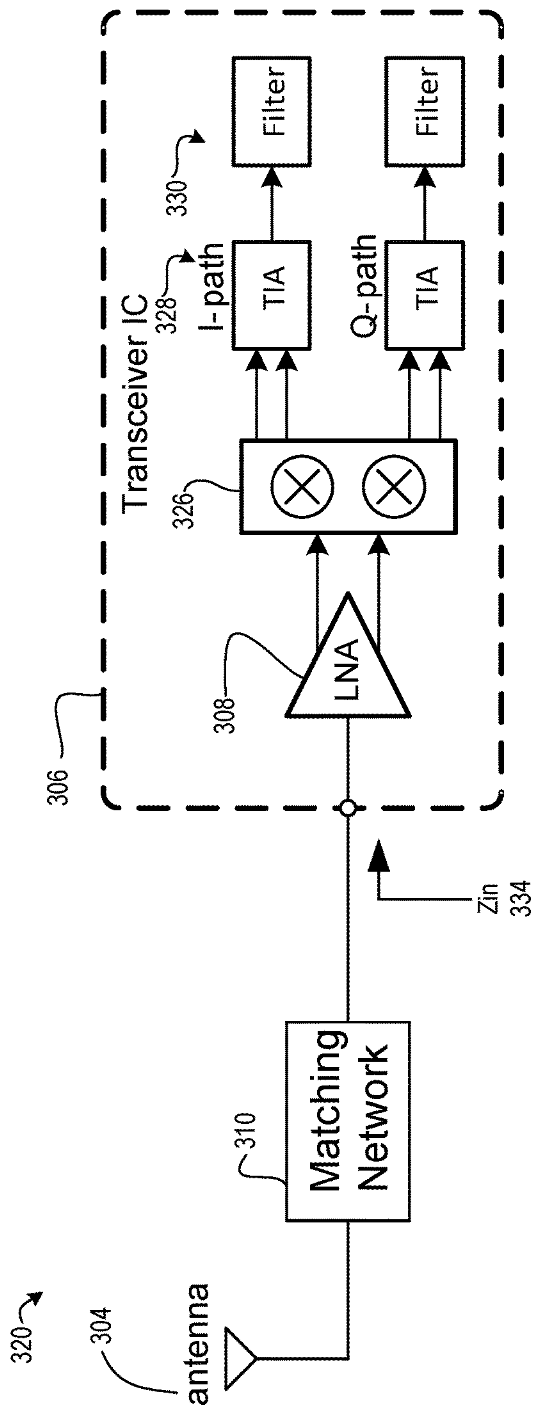
Figure 3C:
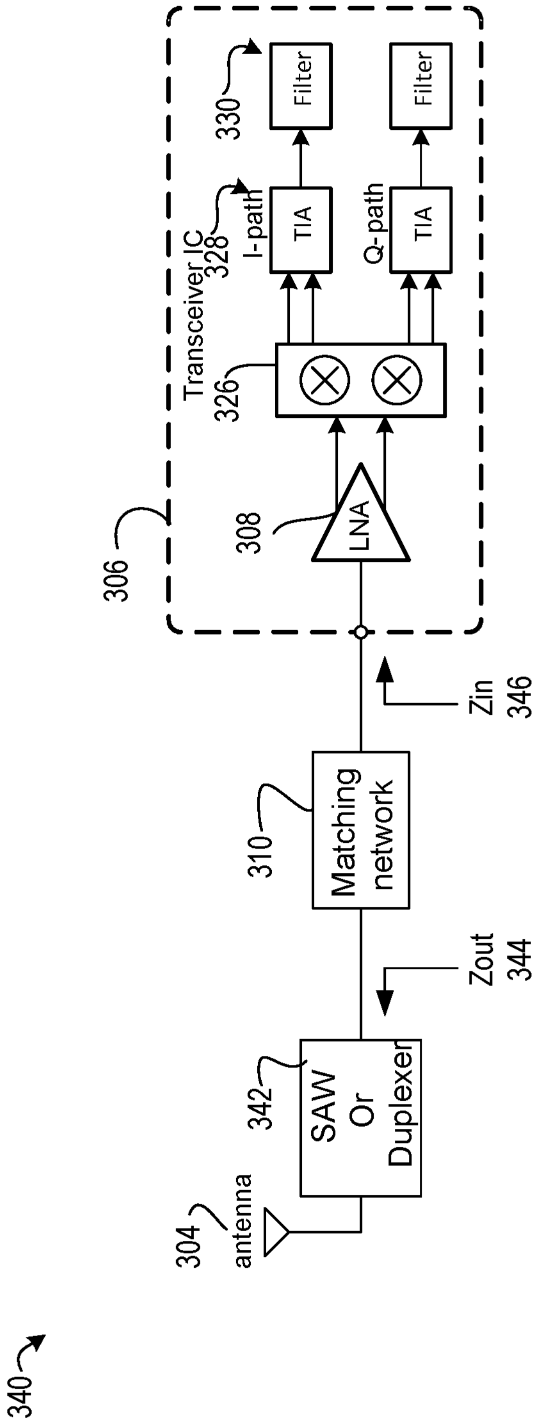

FIGS. 3A-C are block diagrams of example receiver paths including matching networks and transceiver integrated circuits (IC). A receiver path 300 can include an external low noise amplifier (LNA) 302, as depicted in FIG. 3A, coupled to an antenna 304 and configured to receive input RF signals received at antenna 304. The receiver path 300 can further include a transceiver IC 306 following the external LNA 302, where the transceiver IC 306 can be placed several centimeters away from the external LNA, e.g., ~3 cm, ~5 cm, etc. The external LNA 302 can be utilized to provide a first gain amount along a signal path between the antenna 304 and transceiver IC 306. An internal LNA 308 for the transceiver IC 306 can be utilized to provide a second gain amount, where the first gain of the external LNA 302 and the second gain of the internal LNA 308 together generate an overall target LNA gain for the receiver path 300. The receiver path 300 further includes a matching network 310 located between the antenna 304 and external LNA 302.

In some embodiments, receiver path 300 including the external LNA 302 is utilized in high-end communication devices, e.g., smart phones. In other embodiments, e.g., in low-end communication devices, and as shown in FIG. 3B, the external LNA 302 may be removed (or not included), for example, to yield cost-saving and/or space-saving results. Additional components and inputs/outputs shown in FIG. 3A are further described with reference to FIGS. 3B and 3C.

As depicted in FIG. 3B, receiver path 320 does not include an external LNA between the antenna 304 and transceiver IC 306. In the embodiment presented in FIG. 3B, circuitry or settings the transceiver IC 306 in the receiver path 320 are configured to generate greater gain than is generated by transceiver IC 306 in receiver path 300 to compensate for gain provided by the external LNA in the receiver path 300. The gain of receiver path 320 is increased to compensate for not including the external LNA (as in receiver path 300) by modifying the input impedance to provide the necessary passive voltage gain, as described in further detail below with reference to FIGS. 11-16. The input receiver circuitry in the transceiver IC 306 typically consists of an input low noise amplifier (LNA) 308, which may be implemented as a transconductance (gm) gain stage that also provides single-ended to differential conversion and programmable gain. The differential output of the transconductance stage then drives a passive fully-balanced mixer 326, a transimpedance amplifier (TIA) 328, and a lowpass filter 330.

In some embodiments, an input impedance for the LNA 308 is selected at a time of assembly of the transceiver IC 306 and/or at a time of assembly of the receiver path 300, 320. For example, a human operator may select a input impedance of the LNA 308. In another example, an input impedance for LNA 308 can be dynamically adjusted during operation of the transceiver IC, e.g., to switch from a high impedance mode to a low impedance mode. A control signal can be provided by a control circuit operatively connected to the LNA 308 to select a circuit configuration corresponding to a high impedance mode or a low impedance mode. Further details are discussed below, for example, with reference to FIGS. 11-16.

In some embodiments, as depicted in the receiver path 340 in FIG. 3C, a transmitted RF signal is received by the antenna 304 and filtered by a Surface Acoustic Wave (SAW) filter or Duplexer 342. While a duplexer is typically configured to support bidirectional communications, for example, to facilitate antenna sharing for transmit and receive operations, the configuration as shown here only details the connections for the receive path. An output impedance of the SAW or Duplexer 342, Zout 344, may not match the input impedance, Zin 346, of the LNA 308. Similarly, an output impedance of the antenna 304 in FIG. 3B may not match the input impedance, Zin 334, of the LNA 308. The matching network 310 is used to provide matching between the two impedances, Zin and Zout.

In embodiments including an external LNA, e.g., external LNA 302 in FIG. 3A, the output impedance of the external LNA is typically on the order of 50 ohms. In this case, it is desirable that the input impedance, Zin, looking into the transceiver is also on the order of 50 ohms to provide good signal transfer and wide bandwidth.

In embodiments which do not include an external LNA, e.g., FIG. 3B, 3C, the input impedance, Zin 334, 346, looking into the transceiver IC 306 can be advantageously set to a higher impedance (compared to Zout 344) to provide passive gain and, consequently, lower noise figure (NF). A matching network 310 is used to provide the appropriate impedance transformation from the antenna 304, e.g., a 50 Ohm antenna.

Figure 4:
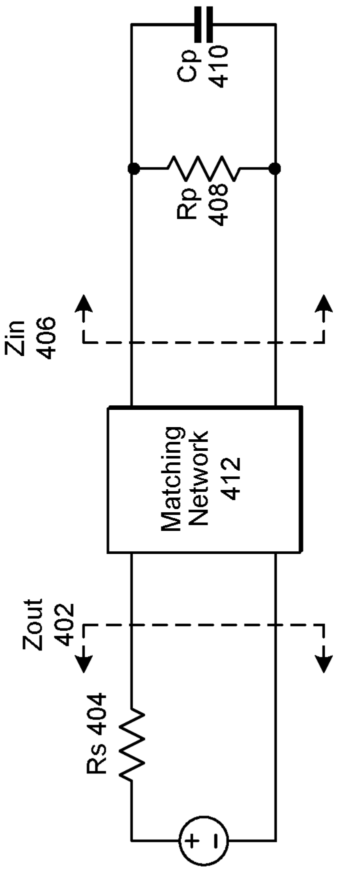
FIG. 4 is a block diagram depicting an impedance model of the receiver path.

FIG. 4 is a block diagram depicting an example impedance model of a receiver path, e.g., receiver paths 300, 320, 340. The output impedance, Zout 402, representing the source impedance Zout 336 of antenna 304 in FIG. 3B or source impedance 344 of SAW or Duplexer 342 in FIG. 3C, can be approximated as a source resistance, Rs 404. An input impedance, Zin 406, of the transceiver IC can be approximated as an effective parallel input resistance, Rp 408, in parallel with an effective parallel capacitance, Cp 410. A matching network 412 operatively coupled between the RF source and the transceiver IC can be utilized to match impedance values of Zout 402 and Zin 406.

A passive voltage gain due to the impedance transformation of the matching network 412 can be achieved by setting the effective parallel input resistance value, Rp, to be larger than the equivalent source resistance, Rs. The passive gain is given by:

$$\text{Gain}_{passive} = \sqrt{\frac{R_p}{R_s}} \tag{1}$$

High passive gain can enable an LNA design with lower noise figure (NF) and lower power dissipation. For example, an Rp=500 Ohms and an Rs=50 Ohms will yield a $\text{Gain}_{passive}$=10 dB.

In some embodiments, Rp can be larger than Rs in order to achieve passive gain of the receive frequency (RX) signal. However, high passive gain can result in a larger quality value (Q value) and a narrower operation bandwidth. A network Q is given by:

$$Q = \sqrt{\frac{R_p}{R_{source}} - 1} \tag{2}$$

Figure 5:
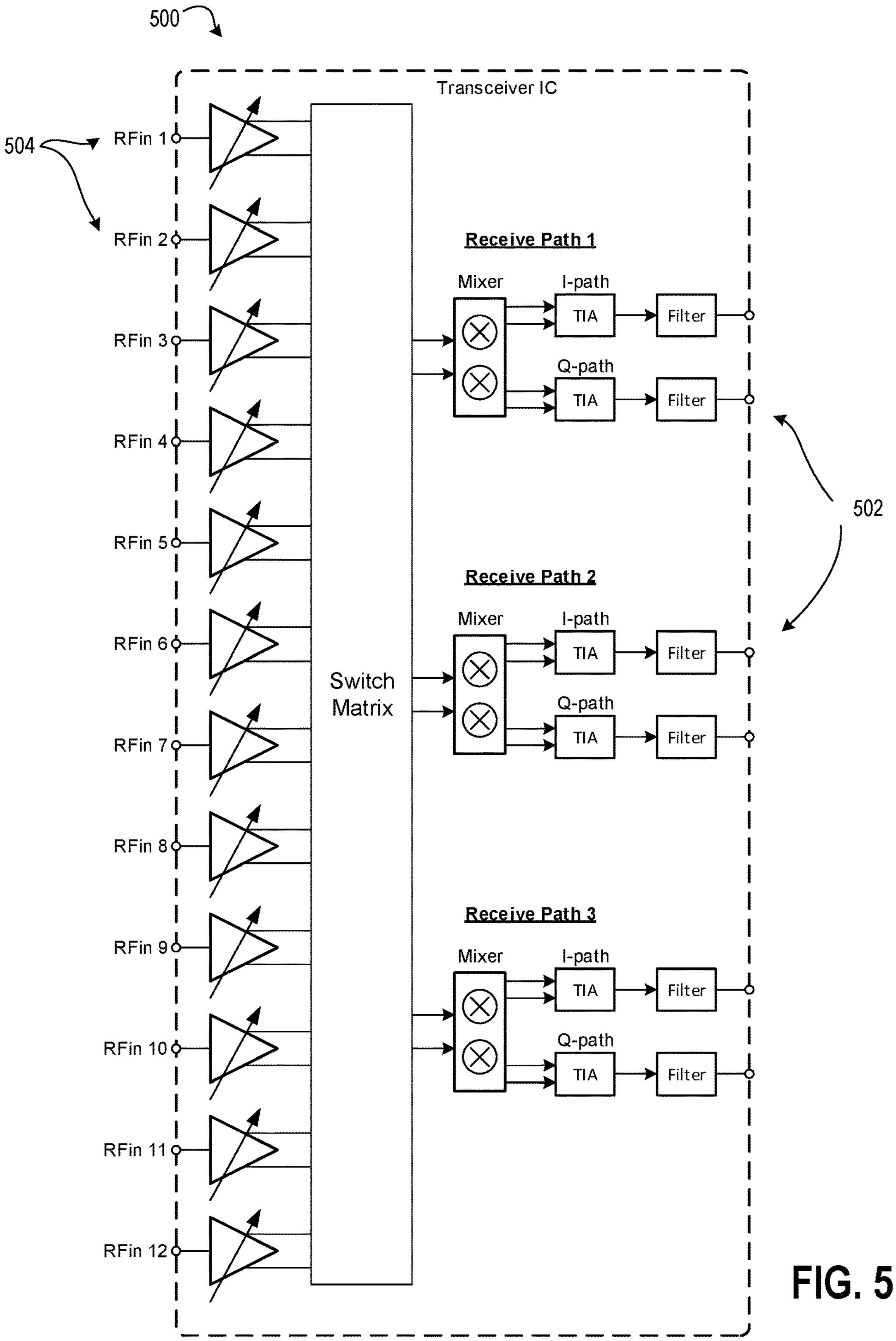
FIG. 5 is a block diagram of an example transceiver IC.
Figure 7:
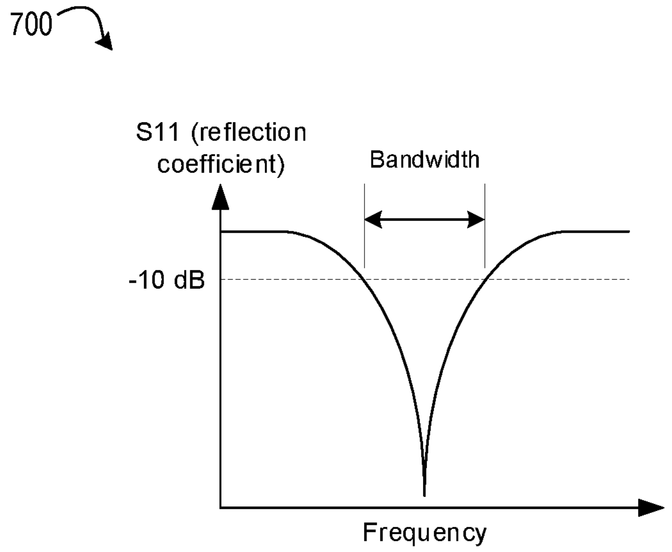
FIG. 7 is a plot of a S11 response of a frequency band for a matched RX input port.
Figure 8:
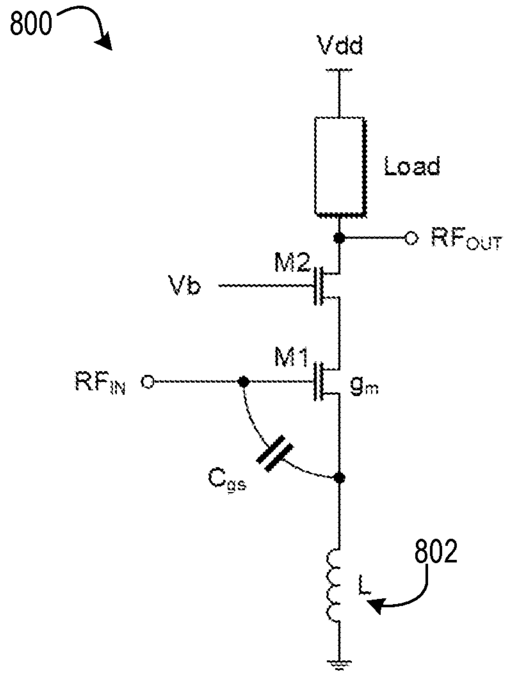
FIG. 8 is a block diagram of an example radio frequency low noise amplifier architecture.
Figure 9:
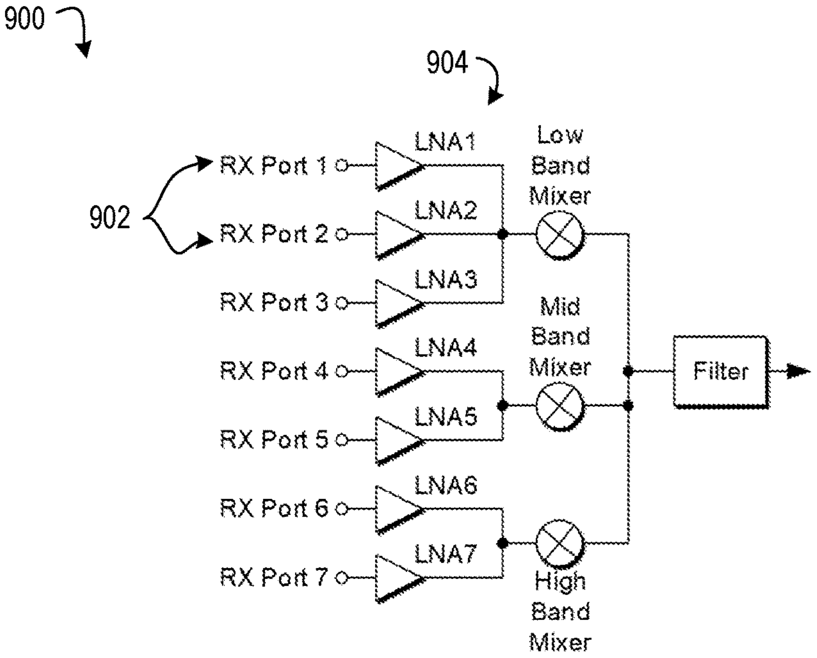
FIG. 9 is a block diagram of an example RF receiver for a range of frequency bands.

FIGS. 5-10 depict example embodiments of RF transceiver IC and LNA structures. In conventional RF transceiver ICs, multiple approaches are possible to extend the operating bandwidth of the RF receiver path, including incorporating multiple input ports to extend the operating frequency range of the RF transceiver IC, as depicted in FIGS. 5 and 9. However, incorporating the multiple input ports can result in additional space and cost when manufacturing the RF transceiver IC. As will be discussed in further detail below with reference to FIGS. 11-20 and 22-30, the embodiments of this invention can reduce or remove the multiple input ports while maintaining the range of operating frequencies of the RF transceiver IC by utilizing a programmable RF LNA structure including an inductor-degenerated transconductance circuit that is integrated into the RF transceiver IC.

In some embodiments, a cellular RF transceiver IC includes multiple RF receiver paths, with each receiver path capable of connecting to a multitude of input ports. FIG. 5 is a block diagram of an example transceiver IC 500, having three receive paths 502 and 12 RF input ports 504.

Figure 6:
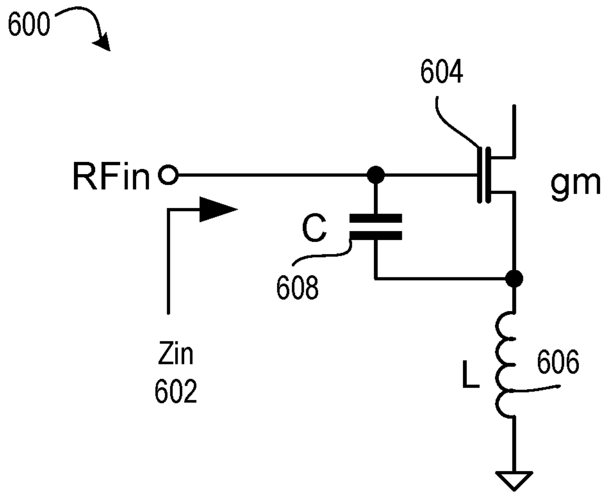
FIG. 6 is a block diagram of an example inductor-degenerated transconductance circuit.

In some embodiments, a low-noise amplifier having a higher input impedance is implemented to achieve enhanced passive gain, as described with reference to equation (1). FIG. 6 is a block diagram of an example inductor-degenerated transconductance circuit 600. An input impedance Zin 602 of the circuit 600 can be defined to a first-order approximation as:

$$Z_{in} \cong \frac{g_m L}{C} + j\left(\omega L - \frac{1}{\omega C}\right) \quad (3)$$

where $g_m$ is the transconductance of the inductor-degenerated transistor 604, L is the inductance of inductor 606, C is the capacitance of the capacitor 608, and ω is the RF input frequency.

The equivalent parallel input resistance, Rp, of the circuit 600 is approximated by:

$$R_p \cong \frac{1}{C}\left(\frac{1}{\omega^2 g_m L} + g_m L\right) \quad (4)$$

A usable frequency range of a given matched RX input port, e.g., input port 504, can be determined by its S11 S-parameter measurements, as shown in an example plot 700 in FIG. 7. An S11 of −10 dB can be used to define a usable bandwidth. Each frequency band typically requires a unique matching network that is specific to that band and provides an S11 response that is appropriately centered on the band of interest, which can result in the need for multiple matching networks matched to respective RX input ports in order for a transceiver IC to operate over a wide range of RX bands.

FIG. 8 is a block diagram of an example radio frequency low noise amplifier architecture. The RF LNA 800 depicted in FIG. 8 includes a cascoded transconductor stage that is degenerated with a source inductor 802. An input impedance for the RF LNA 800 circuit can be described by:

$$Z_{in} = \frac{g_m L}{C_{gs}} + j\left(\omega L - \frac{1}{\omega C_{gs}}\right) \quad (5)$$

where Cgs is the total capacitance between the gate and source of the M1 transistor. An equivalent input network can be modeled as a shunt capacitance, Cp, in parallel with a shunt resistance, Rp, as described previously with reference to FIG. 4 and equation (4). The value of the gate-source capacitance, Cgs, is determined by a sum of the parasitic gate-to-source capacitance of transistor M1 and any additional capacitances placed between the gate and source of M1, as depicted, for example, in FIGS. 21 and 22 below.

For the inductor degenerated transconductance circuit shown in FIG. 8, a real component of the input impedance is approximately Oven by:

$$R_s = \frac{g_m L}{C_{gs}} \quad (6)$$

Given typical values for $C_{gs}$, e.g. in the approximate range of 50 fF to 1 pF, $g_m$L can be relatively large to achieve a desired Rs value, e.g., one that is approximately matched to an RF source impedance of ~50 Ohms, while also achieving a targeted equivalent parallel resistance, Rp, of the circuit 800. In some embodiments, a large inductance can result in excessive gain degeneration of the low noise amplifier. Additionally, a large $g_m$ may require a high bias current and large device size, which may result in excessive gain and power dissipation.

In some embodiments, a transceiver IC, e.g., for cellular device applications, may be designed to operate with receive bands ranging from 700 MHz to 6000 MHz (or larger). The bandwidth of these receive bands might range from as small as 10 MHz to as large as 200 MHz, with a typical bandwidth in the 10 to 75 MHz range. An LNA designed with reasonably high Rp, e.g. 300 to 800 ohms, to take advantage of the passive gain might have a matched bandwidth ranging from 100 MHz to 250 MHz. In order to cover receive bands ranging from 700 to 6000 MHz, transceiver ICs often incorporate a large number of LNA ports with each LNA tailored to operate over a smaller range of frequencies, as depicted in the example receivers of FIGS. 5 and 9 below.

FIG. 9 is a block diagram of an example RF receiver for a range of frequency bands. The RF receiver 900 includes seven RX ports 902 that are used to cover receive bands ranging from 700 to 6000 MHz. Only one LNA of multiple LNAs 904 is active at any given time. Each LNA can be used to cover a small set of frequency bands. For a given frequency band, a unique matching network (not shown) is typically required.

Figure 10:
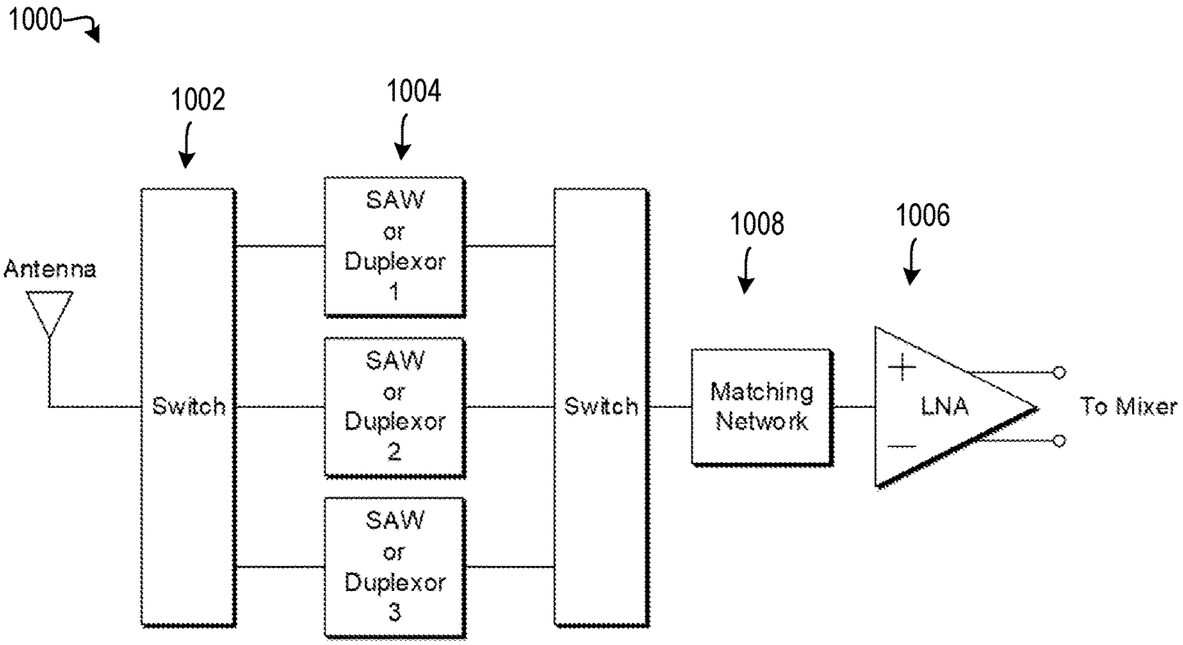
FIG. 10 is a block diagram of another example RF receiver for a range of frequency bands.

For some applications, it may be desirable to utilize a same LNA and matching network for more than one frequency band. FIG. 10 is a block diagram of another example RF receiver 1000 for a range of frequency bands. A switch 1002 is used to direct one of a multitude of RF signal paths (not shown), where each RF signal path is tuned to a different frequency band, to a single LNA input port 1006 with a fixed matching network 1008. The low-noise amplifier can have a higher input impedance for enhanced passive gain by utilizing an inductor-degenerated transconductor input device, e.g., inductor-degenerated transconductor circuit 600.

Dual Mode RF LNA

According to some embodiments of this disclosure, a single dual-mode RF LNA can be switched between a high-gain mode and a low-gain mode, allowing for a common transceiver IC to be used in both high-end and low-end communication devices, e.g., to function in both receiver paths 300 and 320 as described above with reference to FIGS. 3A and 3B. Example dual mode RF front-end low noise amplifier structures including a programmable input impedance circuit are depicted in FIGS. 11-16. The input impedance circuit utilizes an inductor-degenerated transconductor to provide a high input impedance, e.g., 500 Ohms, for creating low-noise passive gain while the dual-mode RF LNA is in a first high-gain operational mode. In a second low-gain operational mode, the inductor-degenerated transconductor circuit is bypassed and an input impedance of the dual-mode RF LNA is set to a nominal low impedance value, e.g., 50 Ohms, using passive or active means.

A passive gain circuit for high-gain mode can provide a gain boost while adding minimal noise. The additional gain boost needed for high-gain operation can be provided by the passive gain associated with the larger input impedance set by the inductor-degenerated transconductor.

In some embodiments, switching between a high-gain mode and a low-gain mode can be determined based in part on a gain requirement of an RF receiver including the RF LNA. In one example, if an input RF signal from an RF source, e.g., received from a base station, is determined by the RF receiver to have a sufficient amount of signal integrity through a receiver path including the RF receiver, then the RF receiver may switch to low-gain mode operation (by selecting a low gain mode circuit), in order to reduce a power dissipation of the RF receiver. In another example, if an input RF signal from an RF source is determined by the RF receiver to be an insufficient amount, e.g., less than a threshold amount, of signal integrity through the receiver path including the RF receiver, then the RF receiver may switch to high-gain mode operation (by selecting the high gain mode circuit). Determining a sufficient amount of signal integrity can include determining a determined signal strength satisfies (e.g., meets or exceeds) a threshold amount of signal strength, a signal-to-noise ratio satisfies (e.g., meets or exceeds) a threshold signal-to-noise ratio, a bit-error rate and/or message-error rate satisfies (e.g., meets or is less than) a threshold error rate, or a combination thereof.

In some embodiments, switching between a high-gain mode and a low-gain mode can be determined based in part on a location of a wireless device, e.g., a mobile phone, relative to a base station including the RF source. For example, the wireless device can be determined, e.g., using geolocation data, to be within a threshold distance of the base station such that the RF receiver will switch the RF LNA to low-gain mode operation.

Figure 11:
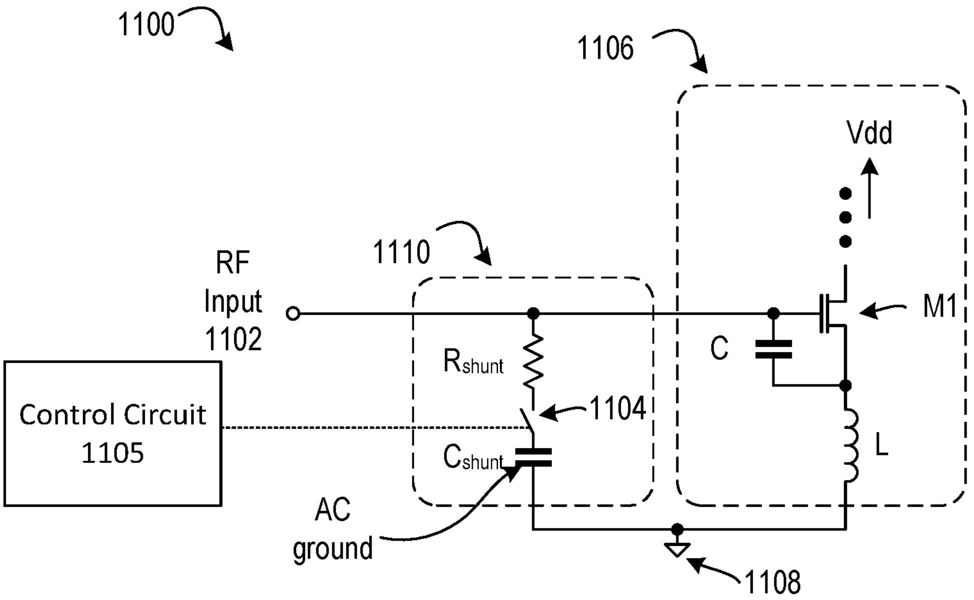
FIG. 11 is a block diagram of an example programmable input impedance circuit according to some embodiments of this disclosure.

FIG. 11 is a circuit diagram of an example programmable input impedance circuit according to some embodiments of this disclosure. A programmable input impedance circuit 1100 is coupled to an RF input 1102. The programmable input impedance circuit can switch between a high impedance mode and a low impedance mode via a switch 1104.

A high impedance mode circuit 1106, e.g., an inductor-degenerated transconductor circuit, is implemented using an inductor-degenerated transconductor transistor M1 biased in a common-source configuration between a ground 1108 and a supply voltage, Vdd. High impedance mode circuit 1106 further includes a capacitor C, where one side of the capacitor is coupled to a gate of the transistor M1 and the other side of the capacitor C is coupled to a source of the transistor M1. A first end of an inductor L is coupled to the source of the transistor M1 and a second end of the inductor L is coupled to ground 1108. The drain of the transistor is coupled to supply voltage Vdd (not shown).

An example input impedance for the programmable input impedance circuit while operating in high impedance mode can range, for example, between 100-750 Ohms. As one example, the input impedance for the programmable input impedance circuit while operating in high impedance mode can be 500 Ohms.

A low impedance mode circuit 1110 is implemented by switching in a shunt resistor between the RF input 1102 and AC ground, e.g., by closing switch 1104. The shunt resistance of resistor, Rshunt, can be programmable, e.g., using a digitally programmable resistor. A typical input resistance value during low-gain mode can range between, for example, 25 to 75 Ohms, e.g., 50 Ohms, allowing for impedance matching to an impedance of an external RF source, Rs. In the embodiment depicted in FIG. 11, the shunt resistor Rshunt is placed in series with a shunt capacitor, Cshunt, to provide direct current (DC) isolation. One end of the shunt resistor is coupled to the RF input 1102 and the other end of the resistor is coupled to the switch 1104. The shunt capacitor Cshunt is coupled on one end to the switch 1104 and to ground 1108 on the other end.

Switch 1104 can be a digital switch, where control of the switch 1104 can be performed by a digital control circuit 1105. Switch 1104 can be programmable, where a 0 state and a 1 state can be set to open or close the switch 1104, respectively. A state of the switch 1104, e.g., open or closed, can be programmed at a point of assembly of the device including the transceiver IC, which in turn includes the RF LNA that can be set to operate in a particular mode based on a device including the transceiver IC.

In some embodiments, a state of the switch 1104 can be variable in response to an operational mode of a device including the programmable input impedance circuit 1100—i.e., the state of the switch can be changed during operation of the device. For example, as discussed below with reference to FIGS. 17-20, a state of switch 1104 can be variable depending on if the RF LNA is operating in a narrowband mode or wideband mode.

As used in this description, narrowband mode (high gain mode, high impedance mode) represents an operational mode of the RF LNA over a narrow range of frequencies and wideband mode (low gain mode, low impedance mode) represents an operational mode of the RF LNA over a wide range of frequencies. In some embodiments, narrowband mode can have a bandwidth range between ~10-15% of a tuned center frequency. Wideband mode can have a bandwidth range that is greater than 1 GHz of a tuned center frequency.

Figure 12:
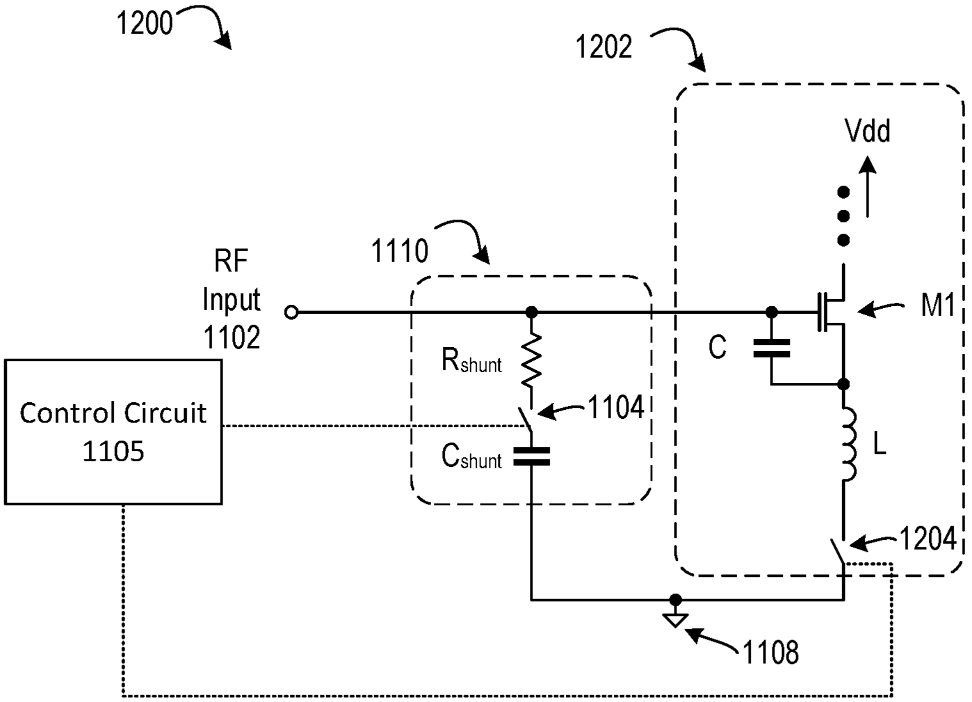
FIG. 12 is a block diagram of another example programmable input impedance circuit according to some embodiments of this disclosure.

During low-gain mode operation, e.g., where switch 1104 is closed, the high impedance mode circuit 1106 can be left in either an enabled, e.g., as depicted in FIG. 11, or in a disabled state, e.g., as depicted in FIG. 12. In embodiments, where the high impedance mode circuit 1106 is left enabled, a high-gain mode impedance (e.g., a nominal 500 Ohm impedance) will be in parallel with the low-gain mode shunt resistor Rshunt. This can allow the low-gain mode shunt resistor Rshunt to have a larger resistance value, which can result in an improvement in an overall noise figure.

Figure 14:
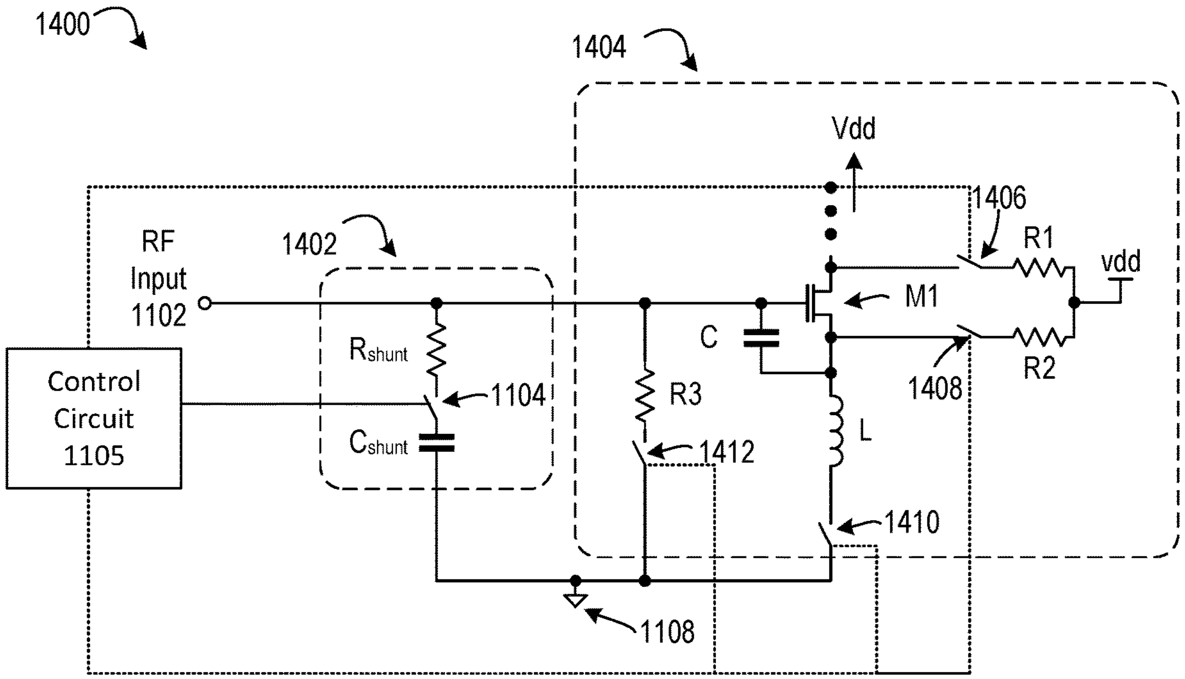
FIG. 14 is a block diagram of another example programmable input impedance circuit according to some embodiments of this disclosure.

In some embodiments, the high impedance mode circuit 1106 can be disabled to reduce power during low-gain mode, e.g., due to power dissipation associated with the high-gain mode impedance circuit 1106, as depicted in FIGS. 12 and 14 below. FIG. 12 is a circuit diagram of another example programmable input impedance circuit 1200 according to some embodiments of this disclosure. As depicted in FIG. 12, a high impedance mode circuit 1202, e.g., a inductor-degenerated transconductor circuit, as described with reference to FIG. 11 further includes a switch 1204 coupled between the inductor L and ground 1108, which can be opened to disable the high impedance mode circuit 1202 when the RF LNA is operating in low-gain/wideband mode, and closed to enable the high impedance mode circuit 1202 when the RF LNA is operating in high-gain/narrowband mode. Likewise, the switch 1104 can be open during high impedance mode operation and closed during low impedance mode operation. Operation of the circuit depicted in FIG. 12 can be summarized by Table 1:

TABLE 1

| Switch 1104 | Switch 1204 | Operational Mode |
|---|---|---|
| Closed | Closed | Low gain mode with high impedance circuit enabled |
| Closed | Open | Low gain mode with high impedance circuit disabled |
| Open | Closed | High gain mode with low impedance circuit disabled |
| Open | Open | LNA circuit 1200 disabled |

Figure 13A:
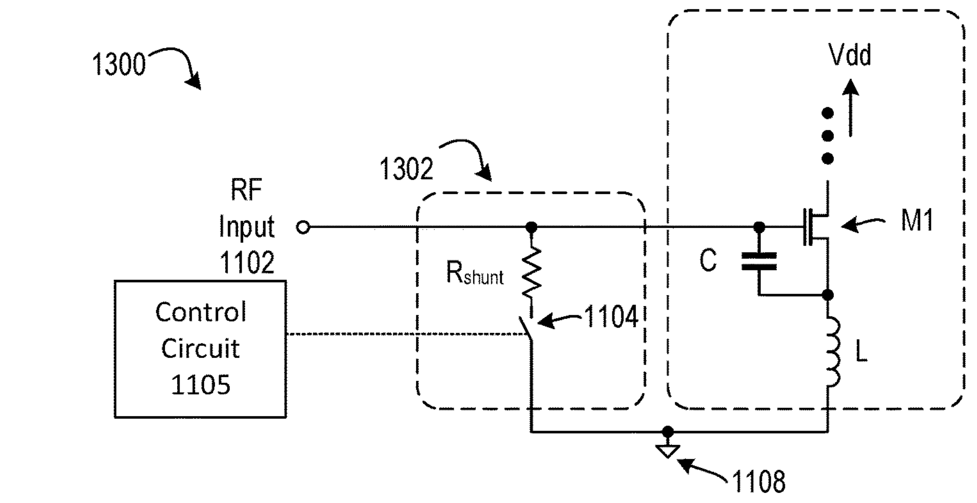
FIGS. 13A-C are block diagrams of other example programmable input impedance circuits according to some embodiments of this disclosure.
Figure 13B:
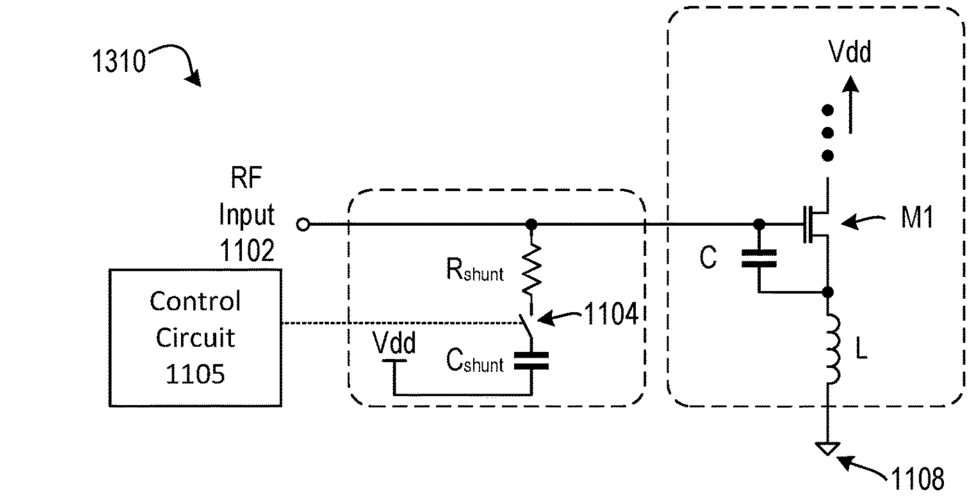
Figure 13C:
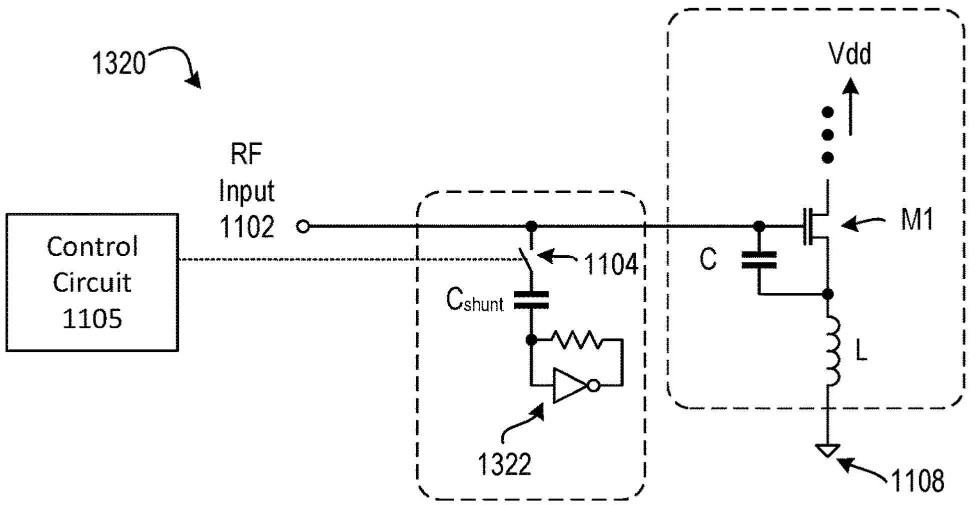

FIGS. 13A-C are circuit diagrams of other example programmable input impedance circuits according to some embodiments of this disclosure. As depicted in FIG. 13A, a low-gain mode circuit 1302 of programmable input impedance circuit 1300 does not include a DC isolation capacitor that is included in the programmable input impedance circuit 1100 depicted in FIG. 11. Eliminating the DC isolation capacitor from the circuit can reduce a total die area required for the circuit.

FIG. 13B depicts an alternative embodiment of another example programmable input impedance circuit according to some embodiments of this disclosure. FIG. 13B depicts an alternate embodiment of a programmable input impedance circuit 1310 in which one end of a DC isolation capacitor, Cshunt, is connected to a supply voltage, Vdd, instead of ground 1108, e.g., for a p-channel metal-oxide semiconductor (pMOS) device capacitor. Alternatively, a n-channel metal-oxide semiconductor (nMOS) device capacitor can be used where one end of the capacitor C shunt would terminate to ground 1108. Selection of an nMOS or a pMOS device capacitor can depend in part on a relative DC biasing across the capacitor. Utilizing metal-oxide-semiconductor field effect transistor (MOSFET) device capacitors can yield greater capacitance per unit area when compared to metal-oxide-metal (MOM) capacitors and can result in reduced die area for the circuit.

FIG. 13C depicts an alternative embodiment of a programmable input impedance circuit 1320 in which a shunt resistor is replaced with an active feedback circuit 1322 for setting the input impedance. Active feedback circuit 1322 is coupled to one end of the capacitor Cshunt, where a second end of the capacitor is coupled to switch 1104. The switch 1104 is coupled between the capacitor C shunt and RF input 1102. The active feedback circuit can be implemented utilizing various circuit elements. In one example, as depicted in FIG. 13C, the active feedback circuit can be implemented using at least one transistor, e.g., an actively biased p-channel metal-oxide-semiconductor (pMOS) and n-channel metal-oxide-semiconductor (nMOS) transistor pair. An impedance of the active feedback circuit 1322 is defined by an inverse sum of the transconductance of the two transistors. A target resistance of the active feedback circuit can be achieved by selecting the respective sizes of the transistors to get a desired transconductance.

FIG. 14 is a block diagram of another example programmable input impedance circuit according to some embodiments of this disclosure. The programmable input impedance circuit 1400 includes a low impedance mode circuit 1402 and a high impedance mode circuit 1404. As depicted in FIG. 14, the high impedance mode circuit 1404, e.g., an inductor-degenerated transconductor circuit, is disabled, e.g., by control circuit 1105, during low-gain mode by switches 1406, 1408, 1410, and 1412. A respective first end of each switch 1406 and 1408 is coupled to a source or drain of transistor M1. High impedance mode circuit 1404 further includes respective resistors R1 and R2, where one end of each resistor is coupled to a second respective end of switches 1406, 1408 and the other end of each resistor is coupled to a supply voltage, Vdd. A first end of switch 1412 is coupled to a first end of resistor R3 and the other end of switch 1412 is coupled to ground. A second end of resistor R3 is coupled to the gate of transistor M1. The high impedance mode circuit 1404 can be disabled, e.g., by control circuit 1105, during low impedance mode by closing switches 1406, 1408, and 1412 to bias the drain/source/gate of M1. Furthermore, inductor L can be disconnected by opening switch 1410, where switch 1410 is coupled between one end of the inductor L and ground 1108, such that the high impedance mode circuit is disabled when switch 1410 is in the open state.

Disabling the high impedance mode circuit 1404 during low-gain mode operation can reduce power dissipation of the programmable input impedance circuit 1400. Additionally, by appropriately biasing the gate/source/drain of transistor M1 and disconnecting the inductor L from ground 1108, a parasitic LC resonance of the programmable input impedance circuit 1400 can be pushed out to higher frequencies that are substantially out of range of the operating frequencies of an RF receiver including the programmable input impedance circuit 1400, e.g., 5× to 10× above the operating frequencies of the RF receiver.

In some embodiments, various options for DC biasing of the shunt resistor and/or shunt capacitor can be implemented, depending in part on process-dependent requirements/advantages. For example, the shunt capacitor could be designed using a p-channel FET device cap, which can require a DC bias of vdd. Alternatively, an n-channel FET device cap can require a DC bias of ground.

In some embodiments, the high-gain mode circuit can be left enabled during low-gain mode, such that a larger value shunt resistance, Rshunt, can be used in the low-gain mode circuit to achieve an improved noise figure.

Figure 15:
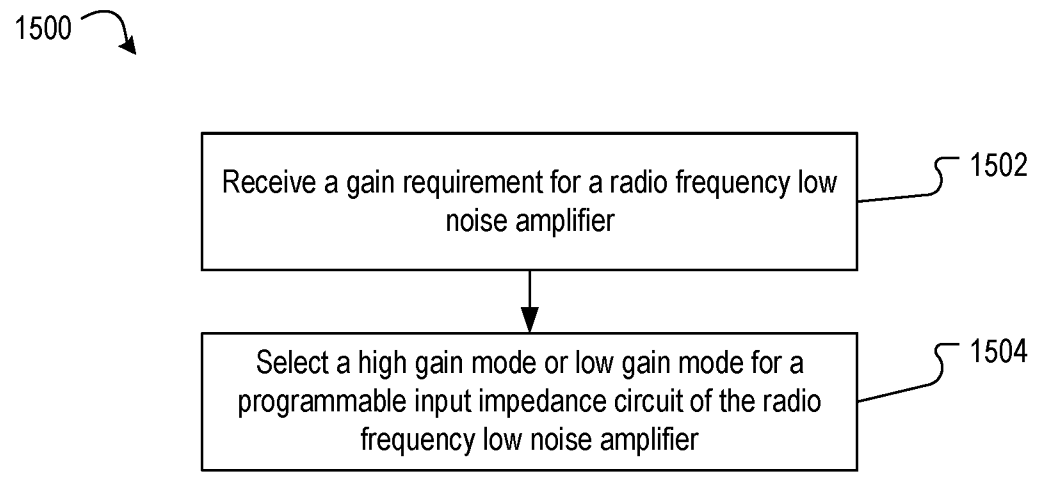
FIG. 15 is a flow diagram of an example process of a programmable input impedance circuit according to some embodiments of this disclosure.

FIG. 15 is a flow diagram of an example process 1500 of a programmable input impedance circuit according to some embodiments of this disclosure.

A gain requirement is received for a transceiver IC (1502). As described above with reference to FIGS. 3A-3C, a transceiver IC can have varying gain requirements for an LNA, for example, depending on whether the receiver path includes an external LNA 302 or not. A gain requirement thus can depend on the type of device, e.g., high-end or low-end, in which the transceiver IC is installed.

In some embodiments, a gain requirement is determined by a manufacturer during assembly of the RF receiver. For example, for an RF receiver that includes an external LNA, e.g., RF receiver path 300, the gain requirement for the RF LNA 308 in the transceiver IC 306 can be a low gain mode/wideband mode. In other words, the RF receiver is configured to utilize the low impedance mode circuit. In another example, for an RF receiver that does not include an external LNA, e.g., RF receiver path 320, the gain requirement for the RF LNA 308 in the transceiver IC 306 can be a high gain mode/narrowband mode. In other words, the RF receiver is configured to utilize the high impedance mode circuit. A manufacturer can select a circuit configuration based on the gain requirement at a point of assembly of the RF receiver by selecting a position of one or more switches of the RF LNA.

In some embodiments, as described below with reference to FIGS. 17-20, a gain requirement can change over time, e.g., depending on an operational requirement of the RF receiver. The gain requirement can change between low gain and high gain (low impedance mode and high impedance mode).

In some embodiments, the gain requirement can be determined by a control circuit operatively coupled to the RF receiver, where the control circuit can determine a change in operational mode of the RF receiver and determine a gain requirement for the change in operational mode. The gain requirement can be determined by circuitry within the transceiver IC which includes the RF receiver, or can be provided by another IC in data communication with the transceiver IC. A circuit configuration can be correlated to a gain outcome for the RF LNA, e.g., in a look up table or a processor-enabled program, where the gain requirement can be received by the control circuit and a circuit configuration including control signals to configure the circuit is provided as output.

A high gain mode or low gain mode for a programmable input impedance circuit is selected (1504). Selecting the high gain mode or low gain mode (high impedance mode circuit or low impedance mode circuit) of the RF LNA can include altering a state of one or more switches to enable/disable the high impedance mode circuit and/or enable/disable the low impedance mode circuit. The control circuit can provide control signals that can alter a state of one or more of the digital switches to configure the programmable input impedance circuit for a particular operational mode.

In some embodiments, the control circuit 1105 can provide control signals to respective switches to alter a state of the switch. In one example, control signals can be provided by the control circuit 1105 according to the states described in Table 1 above. For example, in the circuit depicted in FIG. 11, the high gain mode can be enabled by control signals from the control circuit 1105 that enables high impedance mode circuit 1202 by causing switch 1204 to close. The control circuit 1105 can additionally provide control signals opening switch 1104 to disable low impedance mode circuit 1110 and enable high gain mode. In another example, in the circuit depicted in FIG. 11, the control circuit 1105 can provide control signals to close switch 1104 to enable low gain mode circuit 1110, and optionally provide control signals to open switch 1204 to disable high impedance mode circuit 1202 or to close switch 1204.

As described with reference to FIGS. 11-14, the low impedance mode circuit includes a switch 1104, where opening the switch 1104 disables the low impedance mode circuit 1110, and closing the switch 1104 can enable the low impedance mode circuit 1110. The high impedance mode circuit can include switch 1204, where opening the switch 1204 disconnects the inductor L and disables the high impedance mode circuit, and where closing the switch 1204 can enable the high impedance mode circuit. Furthermore, the high impedance mode circuit can include switches 1406, 1408, and 1412 which can be actuated to enable or disable the high impedance mode circuit.

The control circuit 1105 can provide a control signal to enable/disable the low impedance mode circuit, e.g., by setting a digital switch state to 1 or 0, where "on/enabled" is 1 and "off/disabled" is 0.

Figure 16:
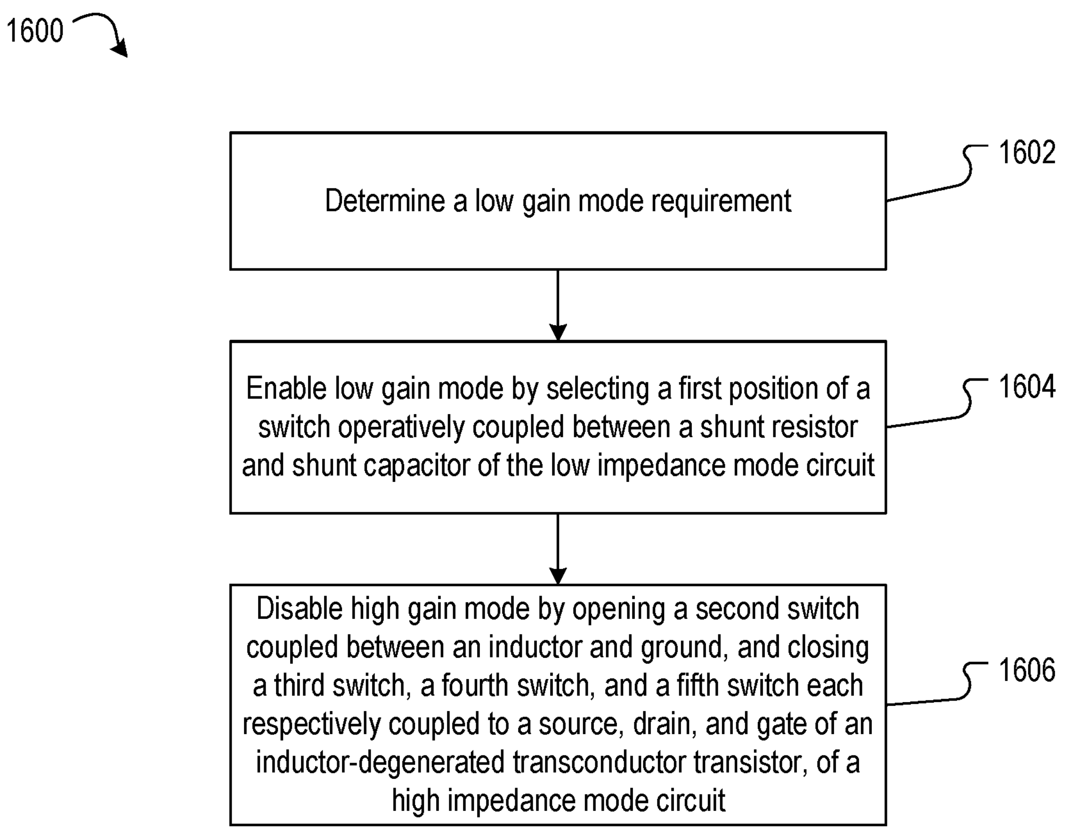
FIG. 16 is a flow diagram of another example process of a programmable input impedance circuit according to some embodiments of this disclosure.

FIG. 16 is a flow diagram of another example process 1600 of a programmable input impedance circuit according to some embodiments of this disclosure.

A low gain mode requirement is determined (1602). A low gain mode can be determined by a manufacturer or at the point of assembly of the RF LNA and/or RF receiver. The low gain mode requirement can be determined by a control circuit, e.g., control circuit 1105 as described above with reference to FIG. 11, based on an operative requirement of the RF receiver. In one example, the RF receiver can receive operational instructions from a device, e.g., a mobile communication device, including the RF receiver (e.g., as shown in FIG. 2). The RF receiver may receive instructions to select a wideband operational mode, e.g., in order to scan for a transmitted frequency, or narrowband operational mode (as described with reference to FIG. 20).

As depicted in FIG. 14, selecting a low gain mode can include enabling the low impedance mode circuit by selecting a first position of a switch operatively coupled between a shunt resistor and shunt capacitor of the low impedance mode circuit (1604). As depicted, switch 1104 is closed to enable the low impedance circuit 1402. In some embodiments, selecting low gain mode is performed by a manufacturer during assembly. In other embodiments, selecting low gain mode is performed by the control circuit (e.g., control circuit 1105), where the control circuit provides control signals to the programmable input impedance circuit to select respective states of the one or more switches of the circuit.

High gain mode is disabled by opening a second switch coupled between an inductor L and ground, and closing a third switch, a fourth switch, and a fifth switch each respectively coupled to a source, drain, and gate of an inductor-degenerated transconductor transistor, of a high impedance mode circuit (1606). As depicted in FIG. 14, disabling high gain mode includes disabling the high impedance circuit 1404 by closing switches 1406, 1408, and 1412, and opening switch 1410. The source, drain, and gate of the transistor M1 are appropriately biased to turn off and disable transistor M1. Biasing the source, drain, and gate of transistor M1 can include selecting a gate-to-source voltage that is below a threshold voltage that is below an operating voltage of the transistor.

Programmable RF Receiver

In some applications, the exact frequency being transmitted to a receiver at a given time may vary. Modern cellular transceivers generally operate over a multitude of RX bands covering a wide range of frequencies. As described with reference to FIG. 9, this can be achieved by implementing a multitude of independent narrow band RX input ports, each capable of receiving a finite number of bands within a limited frequency range. The multitude of independent narrow band RX input ports can increase space requirements for IC receivers, as well as result in higher power requirements. Alternatively, wideband LNAs may be utilized with the potential tradeoff of higher power requirements, lower gain, and higher NF for the ability to operate over a wider bandwidth.

Figure 17:
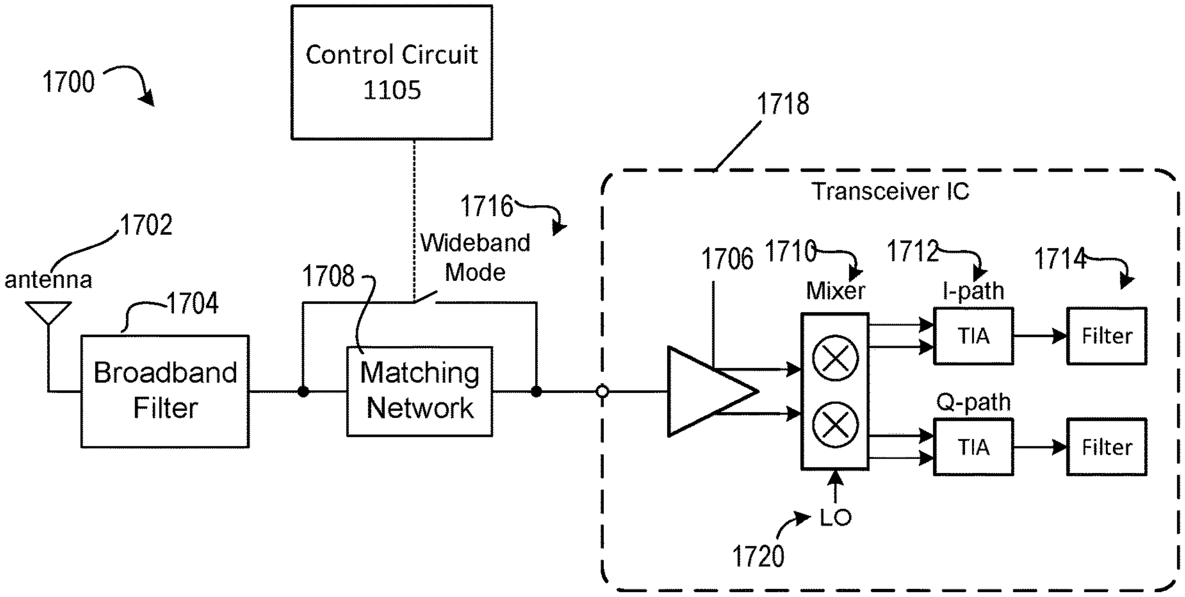
FIG. 17 is a block diagram of an example receiver path including multiple operational modes according to some embodiments of this disclosure.
Figure 18:
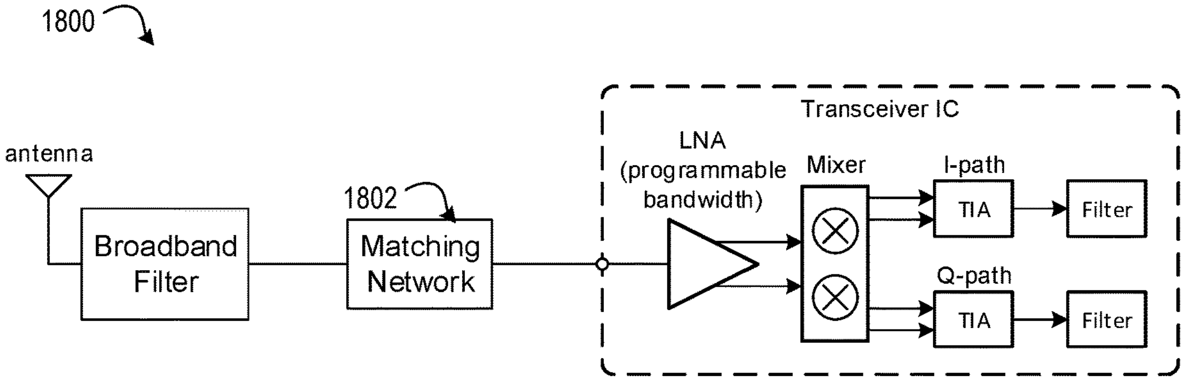
FIG. 18 is a block diagram of another example receiver path including multiple operational modes according to some embodiments of this disclosure.
Figure 19:
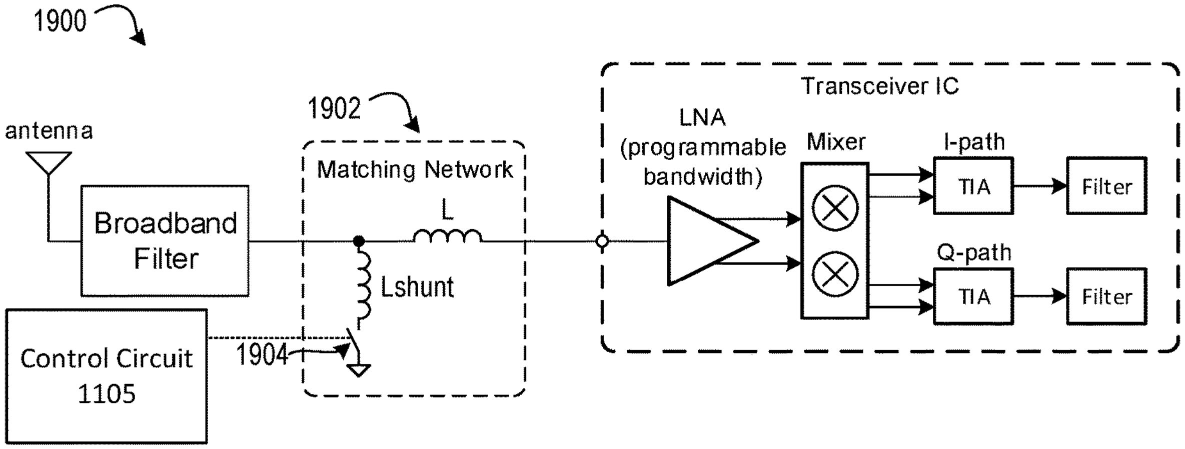
FIG. 19 is a block diagram of another example receiver path including multiple operational modes according to some embodiments of this disclosure.

In some embodiments, it may be desirable to have a single receiver port capable of detecting a transmitted frequency so that it can be tuned to the particular transmitted frequency. In other words, it would be desirable to have a receiver path capable of switching between a wideband mode to scan for a transmitted frequency and a narrowband mode for amplifying the particular detected transmitted frequency. Additionally, a number of input ports, e.g., as depicted in FIGS. 5, and 9, can be reduced while still allowing the transceiver IC to operate over a same range of frequencies, all while not impacting a gain advantage of the transceiver IC and NF requirements. The scanning for the transmitted frequency can be performed by a single transceiver IC 1718 including a single LNA, for example, as depicted in FIGS. 17-19 and including RF LNA structures as depicted in FIGS. 25-30. The structures depicted in FIGS. 17-19 are distinct from the configurations described with reference to FIGS. 5, 9, and 10, in that a single receiver path is utilized which includes a single matching network and transceiver IC structure to perform the scanning for the transmitted frequency.

FIG. 17 is a block diagram of an example receiver path 1700 including multiple operational modes according to some embodiments of this disclosure. An input RF signal is received by an antenna 1702 and filtered by a SAW or duplexer 1704. The output impedance of the SAW or duplexer (Zout) may not match the input impedance of the LNA 1706 (Zin). A matching network 1708 can be used to provide matching between these impedances. A programmable LNA 1706, e.g., a dual-mode LNA with a high impedance mode and a low impedance mode can operate in narrowband mode and wideband mode, respectively, as described in FIGS. 11-14. The programmable LNA amplifies the input RF signal, which is subsequently mixed down to baseband by the mixer 1710 and provided to the transimpedance amplifier (TIA) 1712 and base band filter 1714. As described with reference to FIG. 4, a larger impedance mismatch between Zout and Zin (e.g. Zin>Zout) results in a higher Q associated with the matching network 1708, which leads to a narrower bandwidth operation, e.g., narrowband mode. Alternatively, a wideband mode can be selected, e.g., by setting a state of switch 1716, where there is a minimal impedance mismatch (as is the case where Zout and Zin are approximately equal, e.g., both Zout and Zin are 50 Ohms), such that a wider bandwidth is available.

In some embodiments, as depicted in FIG. 17, receiver path 1700 can be initially configured for wideband mode operation in which the LNA is switched to its wideband mode and the matching network is bypassed by selecting a state of switch 1716. In wideband mode, the RF receiver scans the received signal for a transmitted frequency.

Scanning for the transmitted frequency of the input RF signal includes sweeping a LO frequency 1720 driving the mixer 1710 through a range of RX bands including multiple frequencies. Sweeping the frequency can include stepping through a sequence of frequencies in a set interval, e.g., 100 MHz intervals. The scanning for the transmitted frequency can be performed by a single transceiver IC 1718 including a single LNA. This is distinct from the configurations described with reference to FIGS. 5 and 9, in that a single receiver path is utilized which includes a single matching network and transceiver IC structure to perform the scanning for the transmitted frequency.

In general, the matching process includes down converting the input RF signal to baseband frequency by the mixer 1710 and providing the down-converted signal to the TIA 1712 and base band filter 1714. When an output signal is detected from the base band filter, the particular frequency or band of frequencies of the mixer 1710 are determined to be the transmitted frequency. In other words, for an example of a direct conversion receiver, when the local oscillator (LO) frequency 1720 for the mixer 1710 matches the transmitted frequency of the input RF signal, an output signal will be detected from the transceiver IC 1718.

More particularly, an ideal mixer 1710 can produce an output that consists of the sum and difference frequencies of its two input signals. In a receiver path, e.g., receiver path 300 or 320, the input signals are the RF input being received by the RF receiver and the LO frequency signal. A down-conversion mixer can convert a high RF input frequency to a low output frequency, such that the output frequency of the mixer is the difference between the RF and LO frequencies. The down-conversion mixer output is the Intermediate-Frequency (IF) signal. In the example of a direct conversion receiver, the desired IF frequency is centered at DC (zero hertz). This is known as a Zero IF (ZIF) receiver. The circuit path at the output of the mixer provides bandpass (or low pass filtering in the case of a direct conversion receiver, e.g., filter 1714) such that only a narrow band of frequencies centered at the IF frequency is passed (and can therefore be detected at the output of filter 1714). No output signal will exist at the output of filter 1714 if the difference between the RF input frequency and the LO frequency is not centered at the IF. For a direct conversion (ZIF) receiver, only RF signals bands that are centered at the LO frequency will mix down to DC and pass through the low-pass filter 1714, allowing it to be detected. In other words, when the LO frequency is equal to or near equal to the input RF frequency, e.g., matches or is within an operating bandwidth of the filter 1714, a signal can be detected at the output of filter 1714. For a given RF input signal, the RF input signal can include a 'narrow' band of frequencies such that when the LO frequency 'matches' (e.g., is equal to or within an operating bandwidth of the filter 1714) the center of this band of frequencies, an optimum output signal can be detected at the output of filter 1714.

Once a transmitted frequency is detected, the LNA 1706 is then switched from wideband mode to narrowband mode, tuned to the detected frequency, and the matching network is enabled via the switch 1716. Switching the LNA to narrowband mode can include disabling a wideband mode switch 1716 for the matching network and/or selecting the narrowband mode for the matching network and selecting the high-gain/narrowband circuit of the LNA, as described above with reference to FIGS. 11-14.

As described with reference to FIGS. 11-14, narrowband mode (high gain mode, high impedance mode) is implemented using an inductor-degenerated transconductor circuit to provide a sufficiently large input impedance, Rp, and wideband mode (low gain mode, low impedance mode) is implemented by switching in a shunt resistance to provide an input impedance, Rp, closer to matching a source impedance, Rs, e.g., ~50 ohm.

The operating frequency of the transceiver IC can be tuned to the detected transmitted frequency, as is described below with reference to the tunable RF LNA in FIG. 22.

FIG. 18 is a block diagram of another example receiver path including multiple operational modes according to some embodiments of this disclosure. The receiver path 1800 depicted in FIG. 18 can exclude the wideband mode bypass of the matching network 1708 in receiver path 1700 depicted in FIG. 17. Though configuring the receiver path 1800 in a wideband mode that does not bypass or disable the matching network 1802 may result in some degradation of a received input RF signal, a threshold amount of received signal integrity may be utilized to detect a transmitted frequency of the input RF signal. Exclusion of the wideband mode bypass switch, e.g., switch 1716, can be preferable for particular applications, e.g., for simpler, lower cost circuits.

FIG. 19 is a block diagram of another example receiver path 1900 including multiple operational modes according to some embodiments of this disclosure. As depicted in FIG. 19, rather than bypassing the matching network as described with reference to FIG. 17, a matching network 1902 can be reconfigured during wideband mode operation of the RF receiver. Matching network 1902 can include two different operable circuits, e.g., one for narrowband mode and one for wideband mode. A narrowband mode circuit, which is used for operating in narrowband mode, can include a shunt inductor, Lshunt, and a series inductor, L. Use of a series inductor L matching component can improve a S11 response in wideband mode, which can result in improved signal integrity. To switch to wideband mode, the shunt inductor Lshunt can be disconnected, e.g., by use of a switch 1904, to open the shunt inductor Lshunt, and only include the series inductor L. The series inductor L can be utilized to resonate out series capacitances that are seen looking into the LNA and can result in improved impedance matching.

Figure 20:
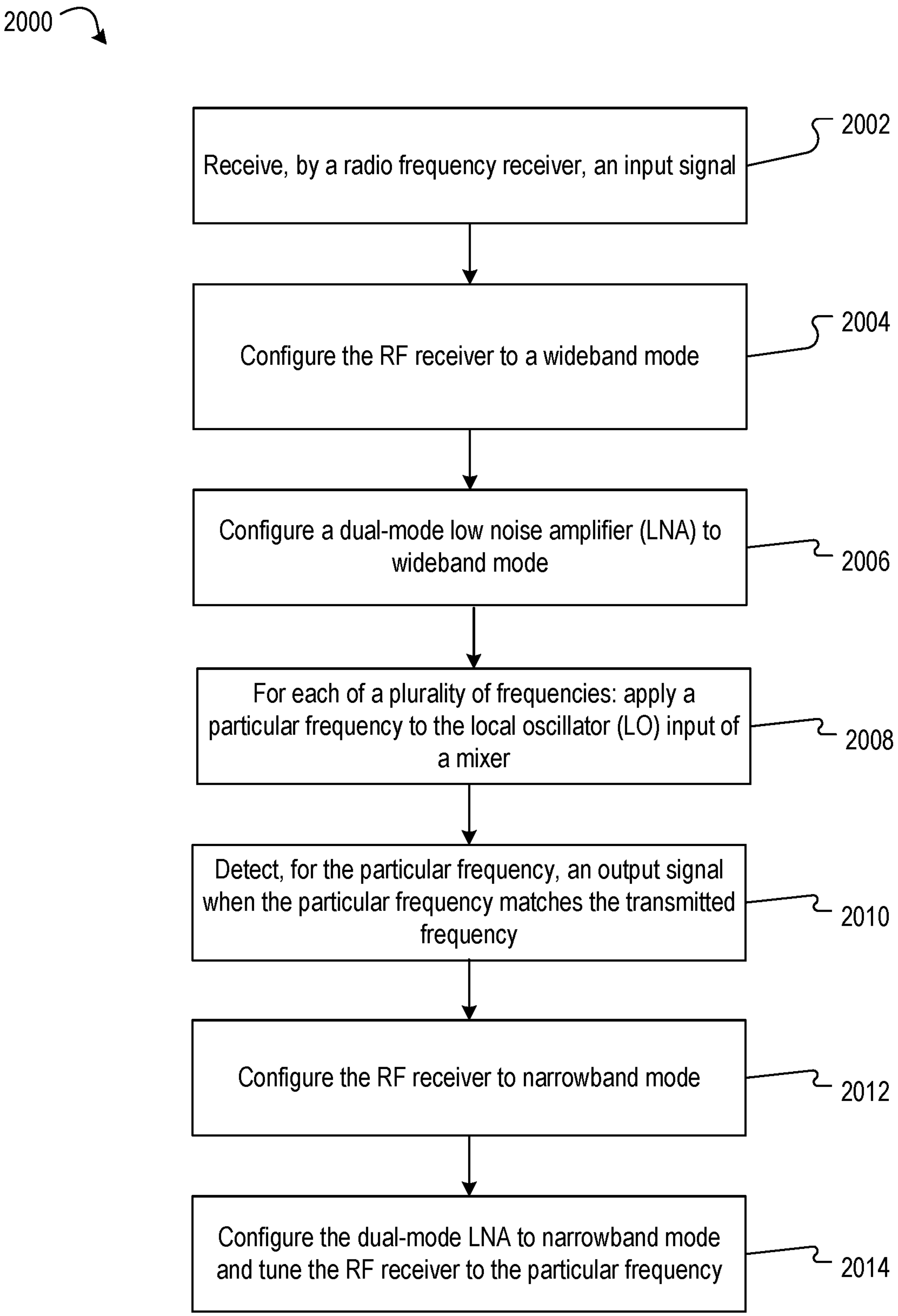
FIG. 20 is a flow diagram of an example process of switching between multiple operational modes of a receiver path according to some embodiments of this disclosure.

FIG. 20 is a flow diagram of an example process 2000 of switching between multiple operational modes of a receiver path according to some embodiments of this disclosure.

An input signal is received by an RF receiver (2002). The input signal includes a transmitted frequency. The RF receiver, e.g., RF receiver depicted in FIGS. 17-19, receives an input signal at an antenna. The transmitted frequency may be unknown during the initial receiving of the input RF signal.

The RF receiver is configured to wideband mode (2004). Configuring the RF receiver to a wideband mode includes configuring a dual-mode LNA to wideband mode (2006). As described with reference to FIGS. 11-14, a programmable input impedance circuit of a dual-mode LNA can be configured to a low impedance mode/low gain mode/wideband mode by configuring the programmable input impedance circuit to select a low impedance mode circuit, e.g., low impedance mode circuit 1110, 1402. In some embodiments, a control circuit 1105 or processor-enabled program provides control signals to the RF receiver to set states of one or more switches to enable/disable the one or more switches and configure the dual-mode LNA to low impedance mode. As depicted in FIG. 14, the control circuit 1105 can provide control signals that cause switch 1104, 1406, 1408, and 1412 to be in a closed/enabled state (e.g., set the state to "1"), and that cause switch 1410 to be in an open/disabled state (e.g., set the state to "0").

In some embodiments, as described with reference to FIGS. 17 and 19, configuring the RF receiver to wideband mode can include configuring a matching network to wideband mode, e.g., by bypassing the matching network or selecting a configuration of the matching network. In some embodiments, the control circuit or processor-enabled program provides control signals to the RF receiver to set a state of the matching network. As depicted in FIG. 17, the control circuit (e.g., control circuit 1105 as described with reference to FIG. 11) can provide control signals that cause switch 1716 to be in a closed/enabled state. As depicted in FIG. 19, the control circuit (e.g., control circuit 1105 as described with reference to FIG. 11) can provide control signals that cause switch 1904 to be in an open/disabled state.

For each of a plurality of frequencies, a particular frequency is applied to the local oscillator (LO) input of a mixer (2008). The particular frequency driving the mixer 1710 can be swept through a range of RX bands including multiple frequencies. Sweeping the frequency can include stepping through a sequence of frequencies in a set interval, e.g., 100 MHz intervals. The signal is mixed down to baseband by the mixer using the particular frequency and provided to the base band filter (as described above and depicted with reference to FIGS. 17-19).

An output signal is detected when the particular frequency matches the transmitted frequency (2010). When an output signal is detected from the base band filter, the particular frequency or band of frequencies driving the mixer are determined by the RF receiver, including a control circuit, e.g., control circuit 1105, or processor-enabled program, to be the transmitted frequency.

The RF receiver is configured to narrowband mode (2012), where configuring the RF receiver to narrowband mode includes configuring the dual-mode LNA to narrowband mode and tuning the RF receiver to the transmitted frequency (2014). As described above with reference to FIGS. 11-14, configuring the dual-mode LNA to narrowband mode includes configuring the programmable input impedance circuit to a high impedance/high gain mode by configuring the programmable input impedance circuit to select the high impedance mode circuit. In some embodiments, a control circuit or processor-enabled program provides control signals to the RF receiver to set states of one or more switches to enable/disable the one or more switches and configure the dual-mode LNA to high impedance mode. As depicted in FIG. 14, the control circuit 1105 can provide control signals that cause switch 1104, 1406, 1408, and 1412 to be in an open/disabled state (e.g., set the state to "0"), and that cause switch 1410 to be in a closed/enabled state (e.g., set the state to "1").

Tuning the frequency of the RF receiver to the particular frequency includes tuning the operating frequency of the LNA to the transmitted frequency, as described in further detail below with reference to FIGS. 21-24. In some embodiments, the control circuit (e.g., a control circuit 1105) or processor-enabled program provides control signals to the RF receiver that cause the LNA to be configured to operate at the transmitted frequency.

In some embodiments, configuring the RF receiver to narrowband mode further includes configuring the matching network to narrowband mode, e.g., by opening the bypass and selecting the matching network, or by selecting a configuration of the matching network. In some embodiments, the control circuit (e.g., a control circuit 1105) or processor-enabled program provides control signals to the RF receiver to set a state of the matching network. As depicted in FIG. 17, the control circuit 1105 can provide control signals that cause switch 1716 to be in an opened/disabled state. As depicted in FIG. 19, the control circuit 1105 can provide control signals that cause switch 1904 to be in a closed/enabled state.

Tunable RF LNA

In some embodiments, it may be desirable to have an LNA structure that can operate over a wide frequency range, for example, frequencies between 400-7000 MHz, e.g., 400-3000 MHz, e.g., 3000-7700 MHz, while maintaining the benefits of a narrow band LNA. A tunable RF LNA, as described herein with reference to FIGS. 22-24, can enable the use of a single narrow band LNA with a fixed matching network for receiving a range of frequency bands while also maintaining a fixed Rp, and which may result in consistent gain for the range of frequency bands.

Figure 21:
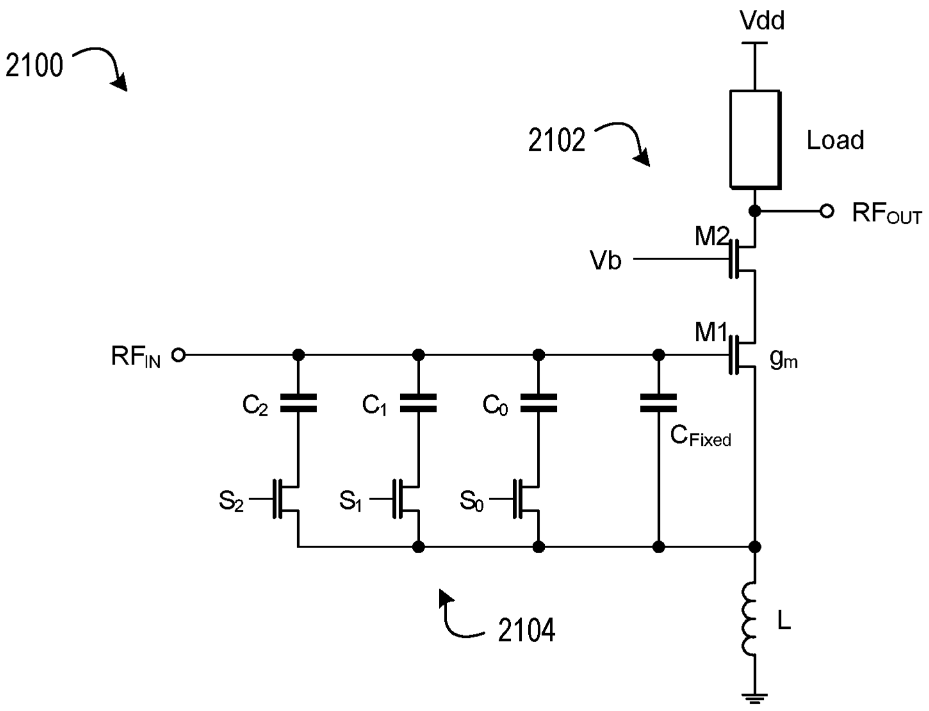
FIG. 21 is a block diagram of an example inductor-degenerated low noise amplifier circuit.

FIG. 21 is a block diagram of an example inductor-degenerated low noise amplifier circuit 2100. As depicted, the circuit 2100 utilizes an inductor-degenerated input stage 2102 with programmable capacitance 2104 between the gate and source of the input transconductor transistor M1 to provide tunability over a set frequency range using a fixed matching network. However, the circuit may result in variation in Rp between the various tuned frequencies, which can lead to variation in the RX line-up gain between the various tuned frequencies.

Figure 22:
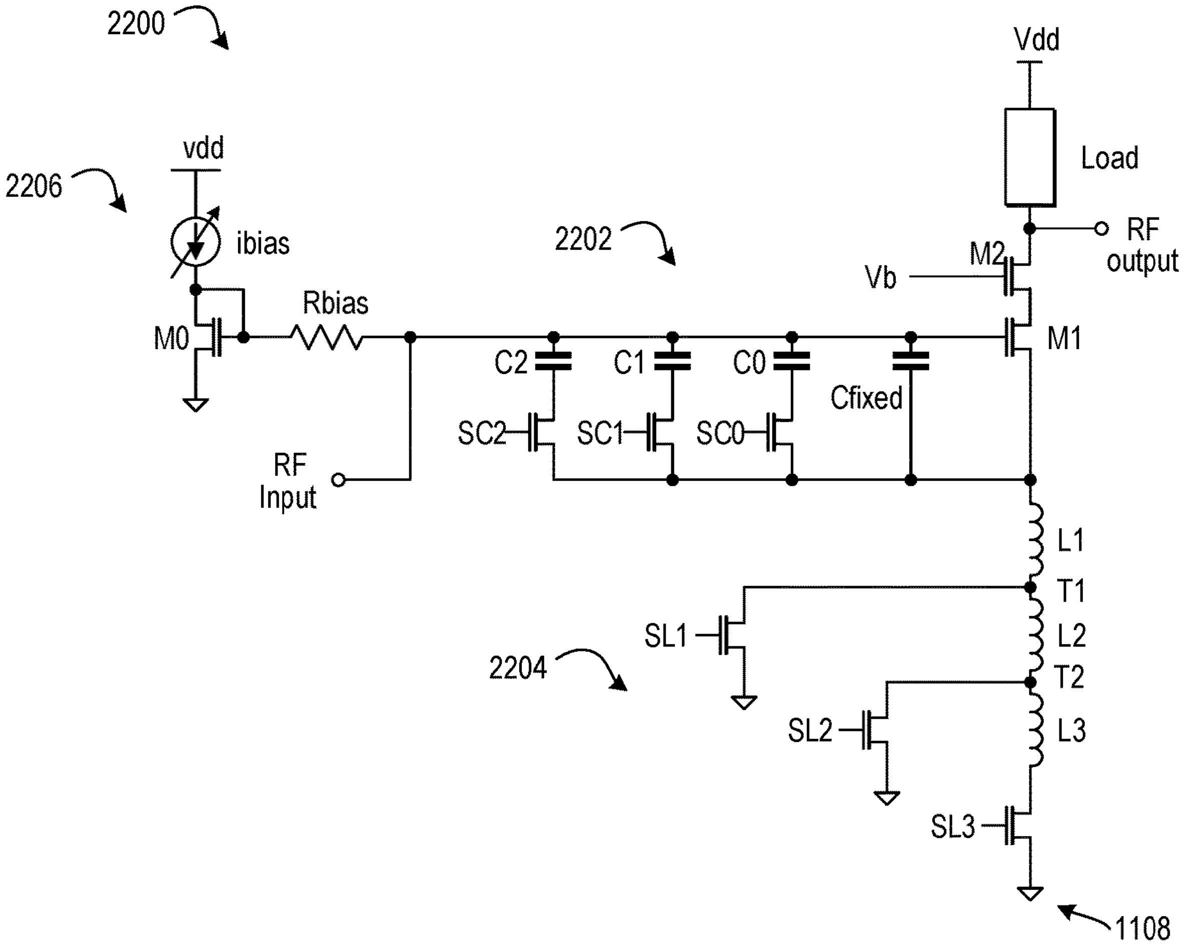
FIG. 22 is a block diagram of an example tunable inductor-degenerated low noise amplifier circuit according to some embodiments of this disclosure.

FIG. 22 is a circuit diagram of an example tunable inductor-degenerated low noise amplifier circuit 2200 according to some embodiments of this disclosure. As depicted in FIG. 22, an inductor-degenerated, narrow band LNA is utilized that has a programmable gate-to-source capacitance, Cgs, via a programmable capacitor network 2202 coupled between a gate and a source of the transistor M1. The programmable capacitor network 2202 includes capacitors Cfixed and C0, C1, C2, where each capacitor C0, C1, and C2 of the capacitor network 2202 is coupled to a respective switch SC0, SC1, and SC2. A capacitance of the programmable capacitor network 2202 can be tuned by selecting states of the switches SC0, SC1, and SC2, respectively. Though depicted in FIG. 22 as including 4 capacitors and 3 respective switches, more or fewer capacitors and more or fewer switches are possible.

The capacitance between the gate and source of the input transistor M1 can be digitally programmable, e.g., using a control circuit (e.g., control circuit 1105), microcontroller, and/or programmable IC. For a given matching network, increasing the Cgs capacitance of M1 shifts the S11 transfer function to a lower frequency. Decreasing the Cgs capacitance of M1 shifts the S11 transfer function to a higher frequency. In other words, by adjusting the Cgs capacitance of M1, the tunable RF LNA can be tuned to a particular operating RF frequency to match a transmitted frequency of an input RF signal.

The LNA structure further includes a programmable inductance via a programmable inductor network 2204 coupled between the source of the transistor M1 and ground 1108. Programmable inductor network 2204 includes inductors L1, L2, and L3 connected in series, where a switch is connected at a tap point between two inductors. As depicted in FIG. 22, SL1 is connected to tap point T1 between inductors L1 and L2 and SL2 is connected to a tap point T2 between inductors L2 and L3. Additionally, a switch SL3 is coupled between an end inductor, e.g., inductor L3, and ground 1108. Though depicted in FIG. 22 as including three inductors and two tap points, more or fewer inductor-segments and tap points are possible.

An inductance of the programmable inductance network 2204 can be tuned by selecting states of the switches SL1, SL2, and SL3, where opening/closing the switches SL1-SL3 shortens/lengthens an effective length of an inductor via the tap points T1 and T2. In the example shown in FIG. 22, when switch SL1 is 'on' (and SL2 and SL3 are 'off'), then the inductance is set to L1. When switch SL2 is 'on' and switch SL1 is 'off' (and SL3 is 'off') the inductance is set to L1+L2. When switch SL3 is 'on' and switches SL1 and SL2 are 'off' the inductance is set to L1+L2+L3.

The LNA structure further has a programmable transconductance of the transistor M1 via a selection of a bias current, ibias, of a digitally programmable bias circuit 2206. As depicted in FIG. 22, an RF input signal is coupled to the gate of transconductor transistor M1. The digitally programmable bias current, ibias, provides a reference current to current mirror transistor M0. The gate of current mirror transistor M0 is coupled to the gate of M1 through bias resistor Rbias. As such, the bias circuit 2206 outputs a reference voltage coupled to the gate of the input transconductance transistor M1, where varying the reference voltage via the digitally programmable bias current ibias generates a variable programmable transconductance of the input transconductor transistor M1. In this way, the transconductance of M1 is adjustable.

The programmability of all three of these values (capacitance, inductance, and transconductance) enables the ability to tune operation of the RF LNA over a wider frequency range, e.g., as compared to the LNA depicted in FIG. 21 or a conventional LNA as depicted in FIG. 8, while keeping Rp fixed to maintain a consistent RX line-up gain at each tuned frequency.

For a target tuned frequency with a given Cgs setting, e.g., to match the transmitted frequency of the input RF signal, the transconductance of M1 and the degeneration inductance can be fine-tuned to maintain a target Rp, minimizing gain variation in the RX line-up.

Figure 23:
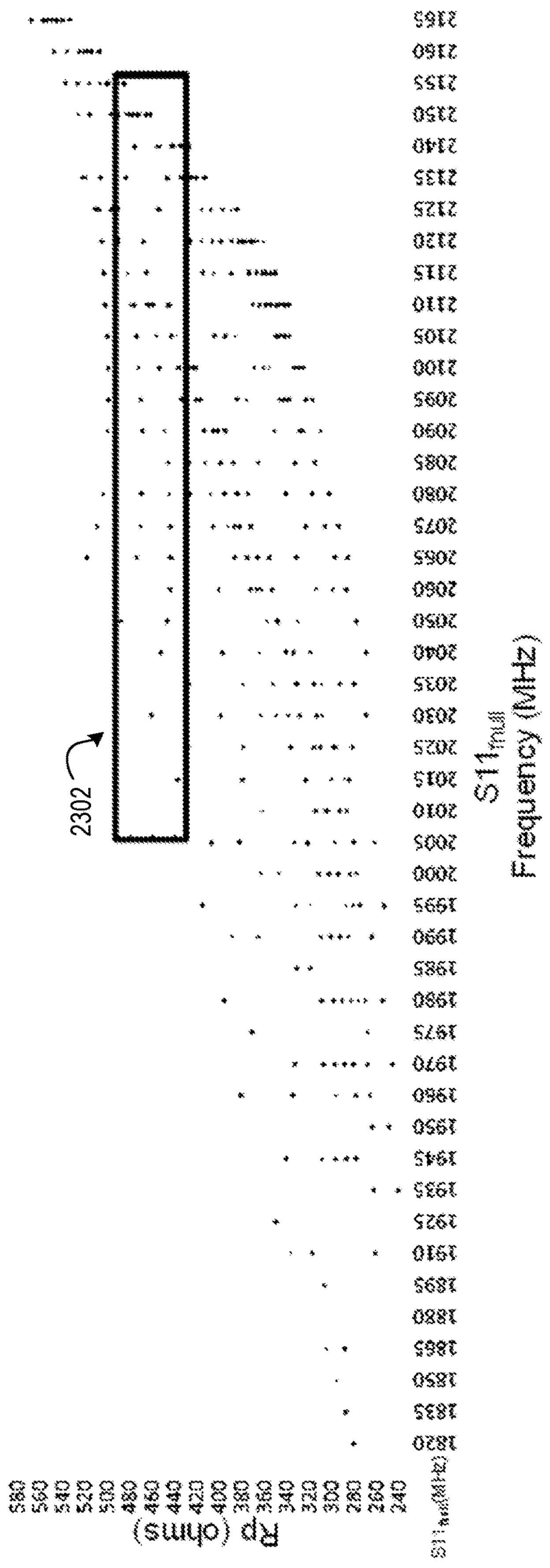
FIG. 23 is a plot of an equivalent parallel resistance of an LNA as a function of operating frequency.

An example plot is illustrated in FIG. 23 in which both the inductance and transconductance are modified in addition to the Cgs, over a range of frequencies. In this case, a substantially constant Rp can be maintained (within the box 2302) over a relatively wide frequency range. A substantially constant Rp can be defined, for example, by a variation of ±40% of Rp relative to a target Rp value over the range of RX bands (range of frequencies). In one example, the variation of Rp relative to the target Rp value is less than ±20% over the range of RX bands, e.g., ±10% variation of Rp relative to the target Rp value.

In some embodiments, one or more of the inductance, transconductance, and capacitance of the LNA structure can be tuned to maintain a substantially constant gain of the RF receiver over a range of RX bands. In one example, the gain of the RF receiver varies ±0.5 dB relative to a target gain of the RF receiver.

Thus, a very small receiver line-up gain variation can be enabled while providing a simple way to achieve multi-band performance and simultaneously realizing the benefits of a narrow band LNA design. These benefits can include high passive gain, lower power dissipation, and low receiver noise figure. The embodiment of FIG. 22 can also provide the opportunity to reduce the number of unique RX input ports, leading to smaller die size and reduced cost.

In some embodiments, a lookup table can be generated, e.g., by a manufacturer of the circuit or an original equipment manufacturer (OEM) utilizing the circuit within a device, that provides the various values of the parameters, e.g., the transconductance, inductance, and gate-to-source capacitance, to achieve a desired Rp for a particular tuned frequency. In some embodiments, a processor-enabled program or control circuitry (e.g., control circuit 1105) can select the appropriate values and resulting circuitry configuration based on the look-up table and then configures the circuitry accordingly, e.g., by actuating the appropriate switches.

Figure 24:
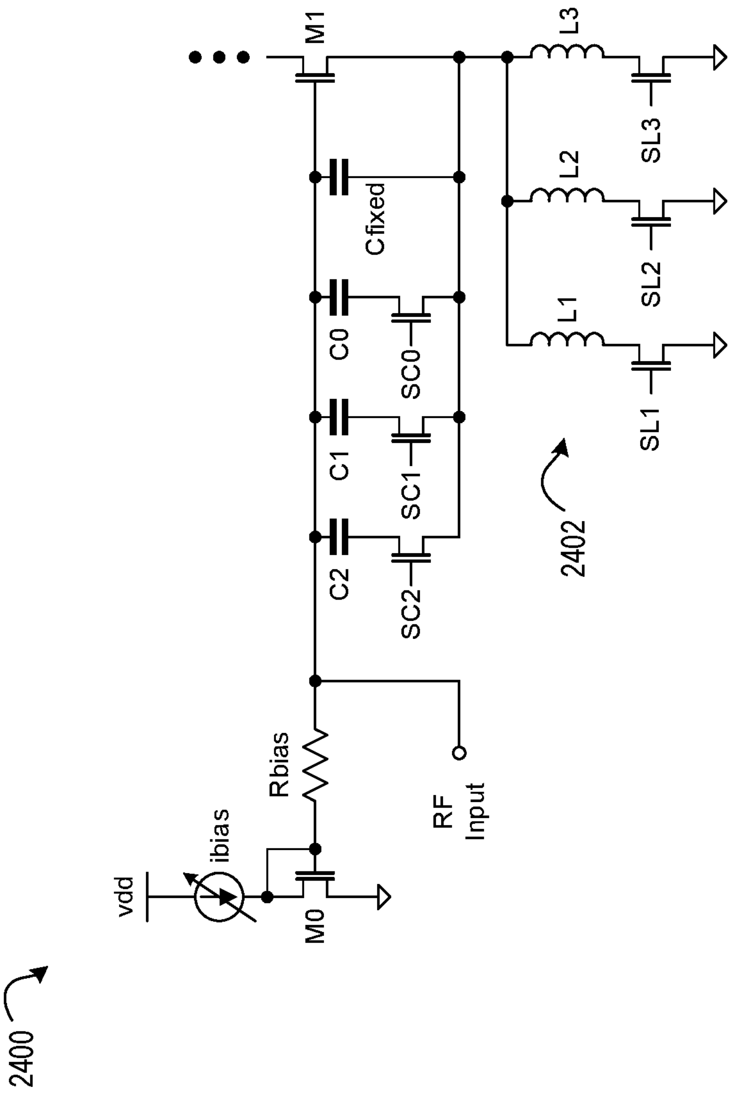
FIG. 24 is a block diagram of another example tunable inductor-degenerated low noise amplifier circuit according to some embodiments of this disclosure.

FIG. 24 is a block diagram of another example tunable inductor-degenerated low noise amplifier circuit according to some embodiments of this disclosure. As depicted in FIG. 24, the tunable inductor-degenerated LNA 2400 includes programmable inductance network 2402 that is implemented using switched parallel inductors L1, L2, L3 instead of switched series inductors.

RF Front-End Low Noise Amplifier Structure

In some embodiments, RF receiver front-end inductor-degenerated transconductance amplifiers can suffer from gain degeneration, high power dissipation, and non-optimal device sizing when designing the gain device and inductor for an improved input match. It may be desirable, as described with reference to FIGS. 25-30 below, to utilize an RF receiver front-end amplifier having low noise and high input impedance, and including an inductor-degenerated transconductor stage optimized for an improved input match while not impacting the normal operation of the amplifier.

In some embodiments, it may be desirable to minimize the number of devices in the matching network. If the real component of the input impedance, Zin, is sufficiently close to the antenna source impedance of 50 ohm, then the matching network can be simplified to a single series device. Therefore, it may be desirable to have an input impedance that has a real component sufficiently close to the antenna source impedance.

The RF front-end low noise amplifier structures described herein with reference to FIGS. 25-29, utilize a high impedance mode circuit, e.g., an inductor-degenerated transconductor input impedance circuit, that is independent of (e.g., is separate from) a main amplifier circuit. The inductor-degenerated transconductor circuit provides a high input impedance for creating low-noise passive gain. Separating the main amplifier circuit from the programmable input impedance circuit allows independent optimization of both circuits. This allows the inductor-degenerated transconductor circuit to be implemented with large inductance and large transconductance values, which can yield an input impedance Rs that is closely matched to a low impedance value of the matching network, e.g., closer to 50 ohms, while not impacting the various design requirements of the main amplifier, e.g. low current, programmable AGC, high output impedance, single-ended to differential conversion, etc.

Additionally, the separated circuit design described with reference to FIGS. 25-29 can provide improved S11 performance over a broader bandwidth without impacting the requirements and needs of the main amplifier. An improved input match can moreover result in a significant external component count reduction (e.g., external to the transceiver IC), resulting in cost-saving, space-saving, and/or power reduction measures. Processes of the separated circuit design of FIGS. 25-29 are described with reference to FIG. 30 below.

Figure 25:
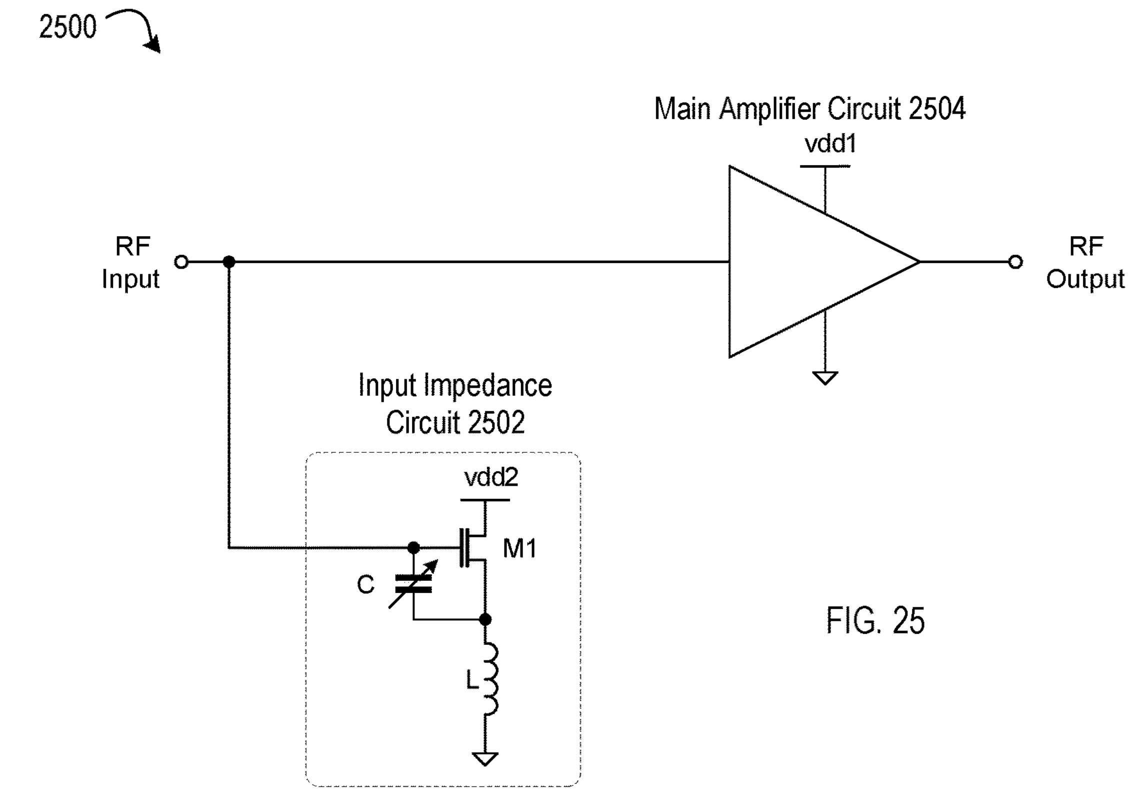
FIG. 25 is a block diagram of an example RF front-end low noise amplifier structure according to some embodiments of this disclosure.

FIG. 25 is a block diagram of an example RF front-end low noise amplifier structure according to some embodiments of this disclosure. An input impedance circuit 2502 including an inductor-degenerated transconductor input impedance circuit, is coupled to an RF input to provide an input impedance. A main amplifier circuit 2504 is coupled to the RF input to provide an amplified RF output signal. The input impedance circuit 2502 and the main amplifier circuit are independent of each other, allowing independent optimization of each circuit.

By decoupling the input impedance circuit 2502 from the main amplifier circuit 2504, the sizing and biasing of the transconductor transistor, M1, and the size of degeneration inductor, L, can be optimized based on input impedance requirements that are independent of the main amplifier circuit's requirements. For example, transistor M1 can be sized with a large width and/or length and high bias current to boost a transconductance of the transistor M1. Additionally, inductor L can be sized large to achieve an overall large gmL product, as described with reference to equations 3-6. However, because the input impedance circuit 2502 is independent of the main amplifier circuit 2504, gain degeneration of the transistor M1 (in the input impedance circuit 2502) due to a large degeneration inductance can have reduced or minimal impact on the operation of the main amplifier. Further, providing a separate and small supply voltage, vdd2, coupled to a drain of the transistor M1 of the input impedance circuit 2502 can minimize the power dissipation when biasing M1 with a large current. In some embodiments, the gate-to-source capacitance, Cgs, of capacitor C is tunable as indicated in FIG. 25. In some embodiments, the Cgs of the circuit 2502 can be tuned as described with reference to FIGS. 22 and 24, e.g., using a programmable capacitor network 2202.

Figure 26:
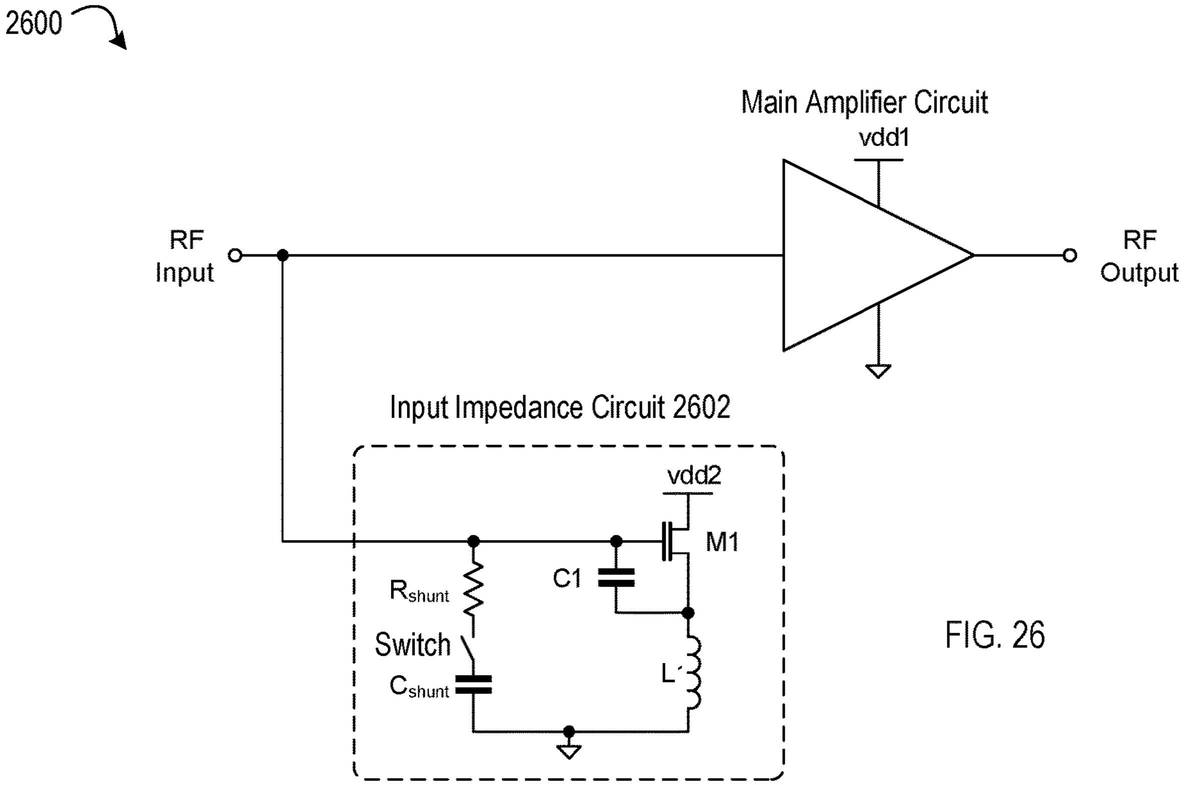
FIG. 26 is a block diagram of another example RF front-end low noise amplifier structure according to some embodiments of this disclosure.

FIG. 26 is a block diagram of another example RF front-end low noise amplifier structure according to some embodiments of this disclosure. As depicted in FIG. 26, RF front-end LNA structure is similar to the structure depicted in FIG. 25, with an input impedance circuit 2602 as described with reference to FIG. 11.

Figure 27:
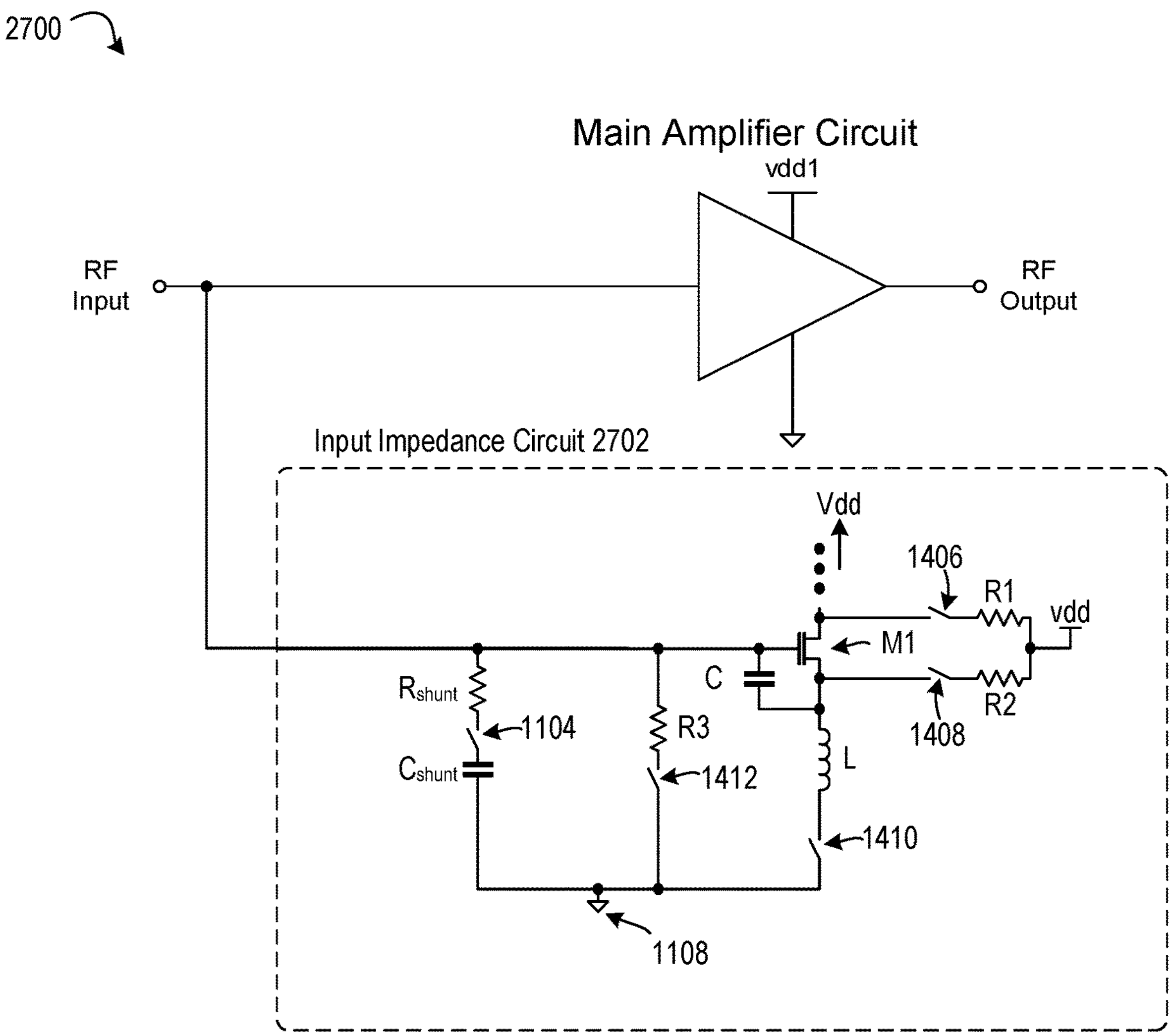
FIG. 27 is a block diagram of another example RF front-end low noise amplifier structure according to some embodiments of this disclosure.

FIG. 27 is a block diagram of another example RF front-end low noise amplifier structure according to some embodiments of this disclosure. As depicted in FIG. 27, RF front-end LNA structure 2700 is similar to the structure 2500 depicted in FIG. 25, with an input impedance circuit 2702 as described with reference to FIG. 14.

Figure 28:
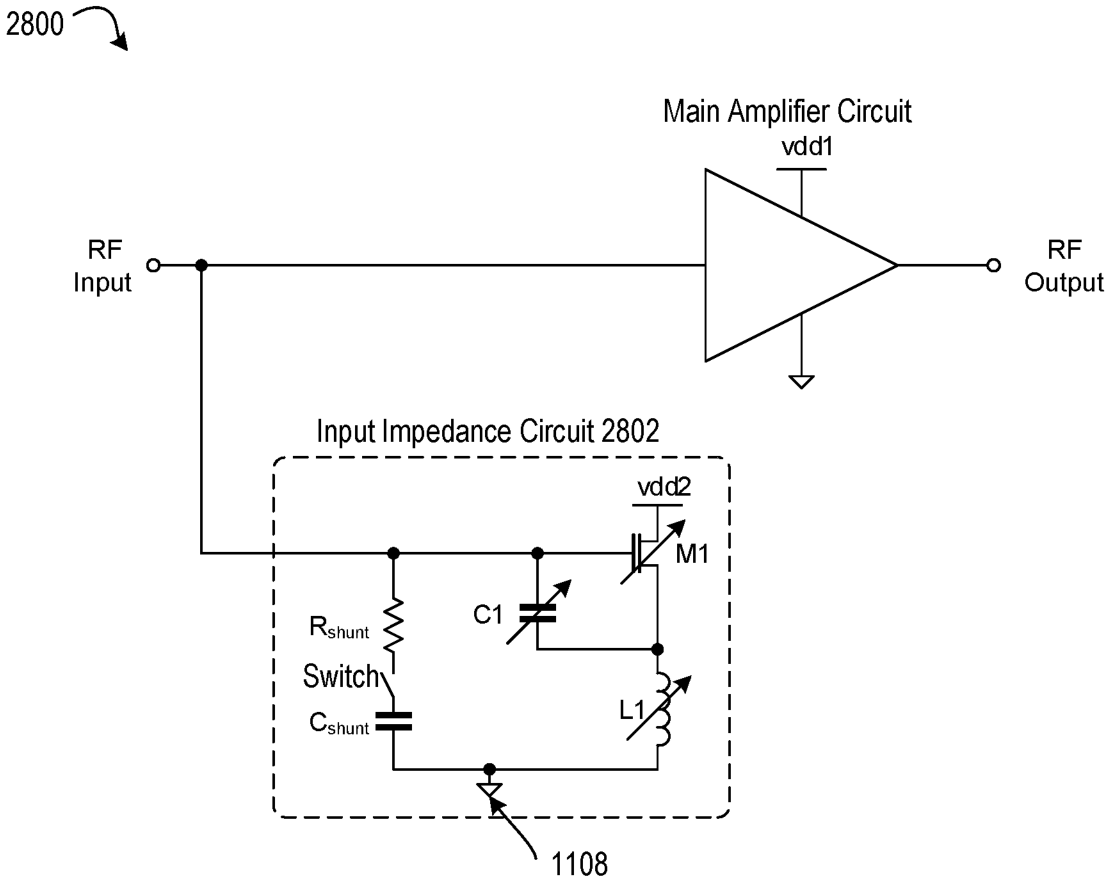
FIG. 28 is a block diagram of another example RF front-end low noise amplifier structure according to some embodiments of this disclosure.

FIG. 28 is a block diagram of another example RF front-end low noise amplifier structure according to some embodiments of this disclosure. As depicted in FIG. 28, RF front-end LNA structure 2800 is similar as the structure depicted in FIG. 25, with an input impedance circuit 2802 further including a tunable inductor L1 coupled between a source of a tunable transistor M1 and ground 1108. The tunable inductor L1 can allow for a reduction in a number of RF input ports needed to serve the range of RF bands. Additionally, utilizing a tunable inductor corresponding to a single port rather than two or more separate inductors corresponding to respective LNA input ports can reduce die area occupied by the circuit.

Figure 29:
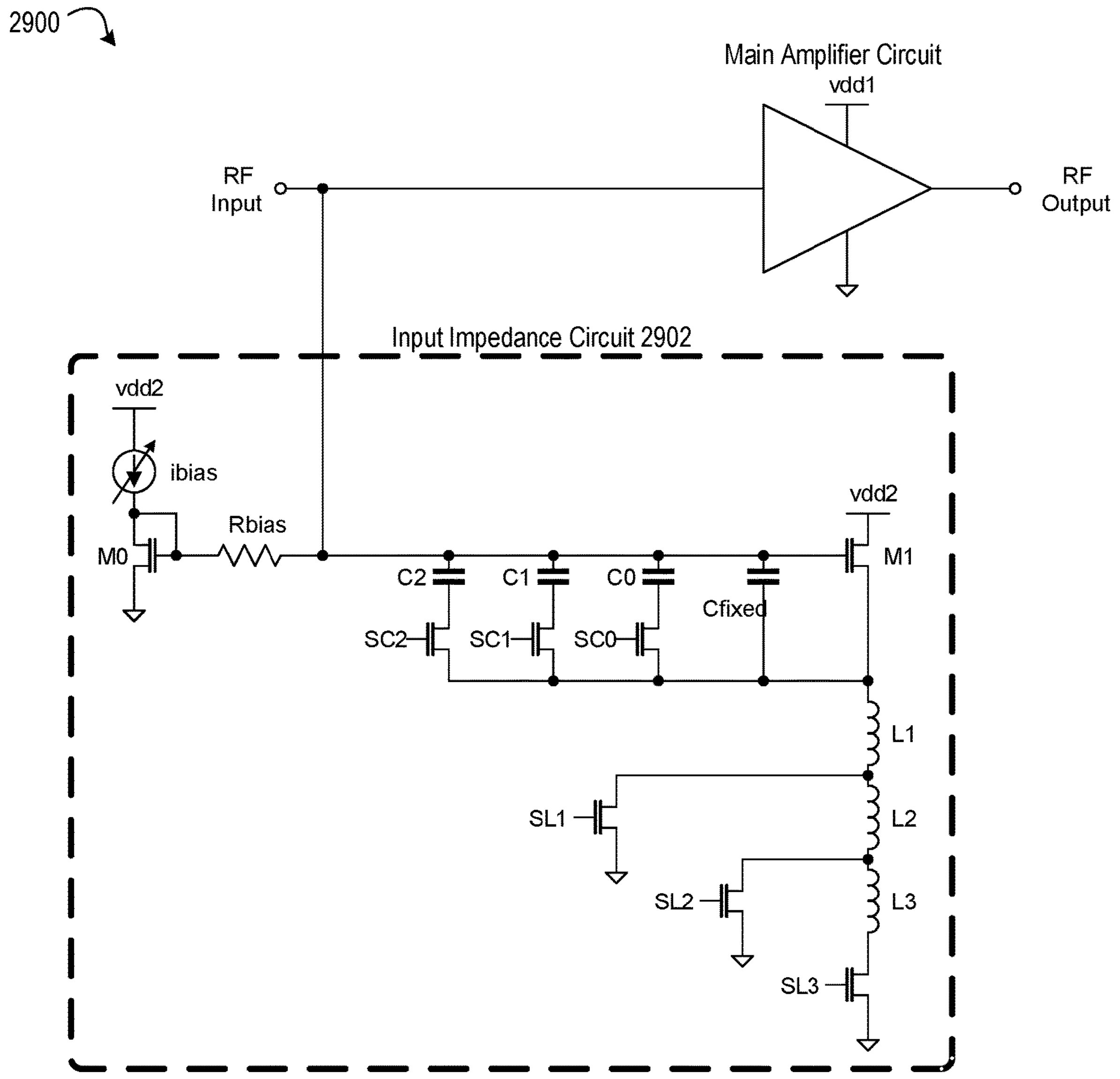
FIG. 29 is a block diagram of another example RF front-end low noise amplifier structure according to some embodiments of this disclosure.

FIG. 29 is a block diagram of another example RF front-end low noise amplifier structure according to some embodiments of this disclosure. As depicted in FIG. 29, RF front-end LNA structure 2900 is similar as the structure depicted in FIG. 25, with an input impedance circuit 2902 having a tunable inductance, capacitance, and transconductance as described with reference to FIG. 22. Utilizing a tunable capacitor, tunable inductor, and tunable transconductance (tunable bias) can add additional degrees of tunability of the circuit to optimize performance for a particular application.

Figure 30:
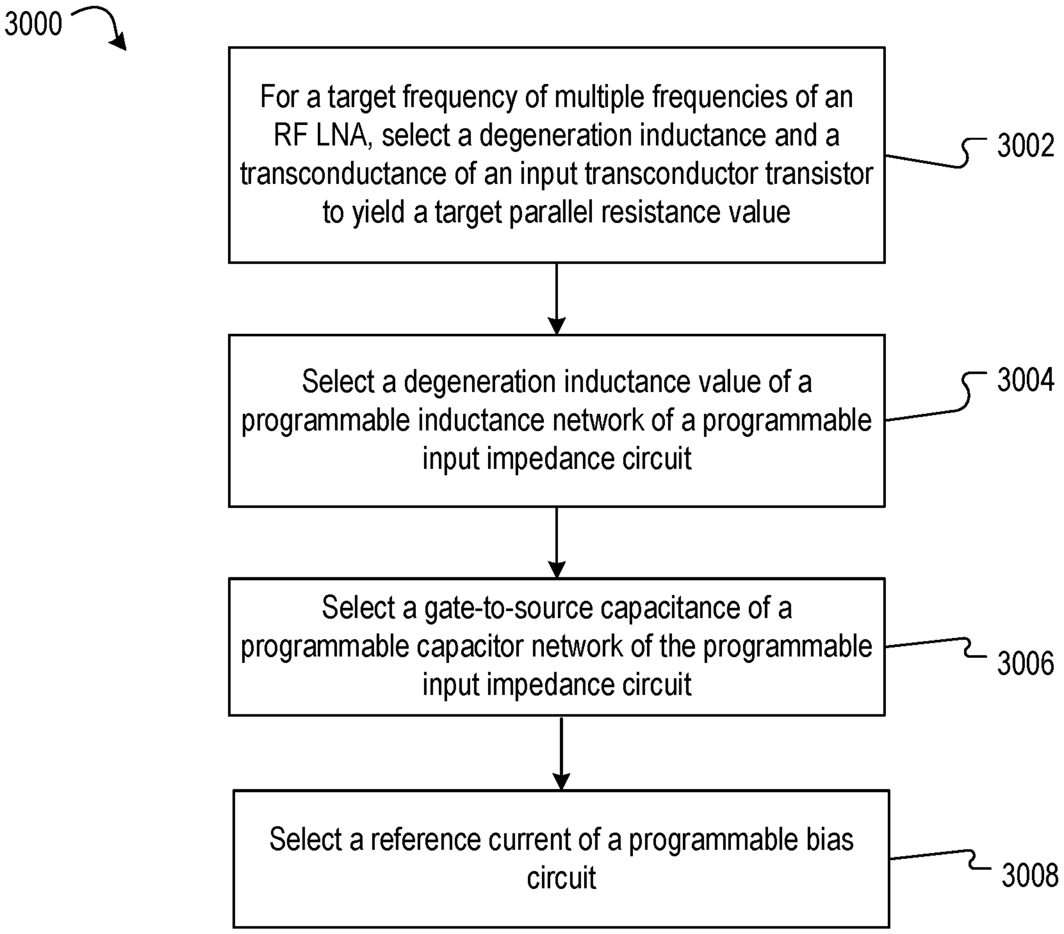
FIG. 30 is a flow diagram of an example process of an RF front-end low noise amplifier structure according to some embodiments of this disclosure.

FIG. 30 is a flow diagram of an example process 3000 of an RF front-end low noise amplifier structure according to some embodiments of this disclosure. The processes described with reference to FIG. 30 can be implemented by the structures described in FIGS. 25-29. In one example, as is described herein, the processes of FIG. 30 can be implemented by the structure depicted in FIG. 29. A degeneration inductance and a transconductance of an input transconductor transistor is selected to yield a target parallel resistance value for a target frequency of multiple frequencies of an RF LNA (3002). A target operating frequency of the RF front-end LNA can be selected, for example, by control circuitry operating an RF receiver including the RF front-end LNA, e.g., control circuit 1105 as described above with reference to FIG. 11. A look up table or other reference program can be utilized to determine values for the degeneration inductance and transconductance of the input transconductor transistor that will yield a target parallel resistance value Rp for the target frequency. The look up table or reference program can be generated, for example, by a manufacturer during the assembly process, and stored in a memory device that is operatively accessible by the control circuit or processor-enabled program. The look up table can further include circuit configuration for the RF LNA to generate the determined values for the degeneration inductance and transconductance of the input transconductor transistor.

A degeneration inductance value of a programmable inductance network of a programmable input impedance circuit is selected (3004). Control circuitry and/or a processor-enabled program can enable the circuit configuration to yield the degeneration inductance value, e.g., by selecting states of switches in the RF LNA. In one example, as depicted in FIG. 22, a control circuit, e.g., control circuit 1105 as described above with reference to FIG. 11, can provide instructions to digital switches SL1, SL2, and SL3 to set particular states of the respective switches in order to yield the degeneration inductance value.

A gate-to-source capacitance of a programmable capacitor network of the programmable input impedance circuit is selected (3006). Control circuitry and/or a processor-enabled program can enable the circuit configuration to yield the Cgs value by selecting states of switches in the programmable capacitor network. In one example, as depicted in FIG. 22, a control circuit, e.g., control circuit 1105 as described above with reference to FIG. 11, can provide instructions to digital switches SC0, SC1, and SC3 to set particular states of the respective switches in order to yield the Cgs value.

A reference current of a programmable bias circuit is selected (3008). Control circuitry and/or a processor-enabled program can provide instructions to set the reference current, ibias of the programmable bias circuit. As depicted in FIG. 22, the programmable bias circuit includes a digitally-tunable reference current that can be tuned by a control circuit, e.g., control circuit 1105 as described above with reference to FIG. 11, to yield the reference current.

Embodiments of the subject matter and the operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer programs, i.e., one or more modules of computer program instructions, encoded on computer storage media (or medium) for execution by, or to control the operation of, data processing apparatus. Alternatively, or in addition, the program instructions can be encoded on an artificially generated propagated signal, e.g., a machine-generated electrical, optical, or electromagnetic signal that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially-generated propagated signal. The computer storage medium can also be, or be included in, one or more separate physical components or media (e.g., multiple CDs, disks, or other storage devices).

The operations described in this specification can be implemented as operations performed by a data processing apparatus on data stored on one or more computer-readable storage devices or received from other sources.

The term “data processing apparatus” encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application-specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application-specific integrated circuit).

Processors suitable for the execution of a computer program include, by way of example, both general and special purpose microprocessors. Generally, a processor will receive instructions and data from a read-only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

Embodiments of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described in this specification, or any combination of one or more such back-end, middleware, or front-end components. The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

The computing system can include clients and servers. A client and server are generally remote from each other and typically interact through a communication network. The relationship of client and server arises by virtue of computer programs running on the respective computers and having a client-server relationship to each other. In some embodiments, a server transmits data (e.g., an HTML page) to a client device (e.g., for purposes of displaying data to and receiving user input from a user interacting with the client device). Data generated at the client device (e.g., a result of the user interaction) can be received from the client device at the server.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially be claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A tunable radio frequency (RF) low noise amplifier (LNA) circuit comprising:

an amplifier circuit, wherein the amplifier circuit is configured to receive an input RF signal from an RF input source and provide an amplified output RF signal;

a bias resistor, wherein a first end of the bias resistor is operatively coupled to an input of the amplifier circuit;

a digitally programmable bias circuit operatively coupled to a second end of the bias resistor, wherein the bias circuit outputs a reference voltage; and a programmable input impedance circuit operatively coupled between the first end of the bias resistor and a ground, comprising:

an input transconductor transistor, wherein a gate-to-source capacitance between a gate and a source of the input transconductor transistor is programmable by a programmable capacitor network comprising at least one capacitor coupled to a first switch, wherein a first side of the programmable capacitor network is coupled to the gate of the input transconductor transistor and second side of the programmable capacitor network is coupled to the source of the input transconductor transistor; and a programmable inductance network comprising at least a first inductor coupled to a second switch, wherein a first end of the programmable inductance network is coupled to the source of the input transconductor transistor and a second end of the programmable inductance network is coupled to ground, wherein the reference voltage of the digitally programmable bias circuit is coupled to the gate of the input transconductance transistor, and wherein varying the reference voltage generates a variable programmable transconductance of the input transconductor transistor.

2. The tunable RF LNA circuit of claim 1, wherein a degeneration inductance of the programmable inductance network is digitally programmable using the second switch, operatively connected to the at least first inductor.

3. The tunable RF LNA circuit of claim 1, wherein the programmable inductance network further comprises a third switch and a second inductor and a third inductor, wherein:

the second inductor is coupled to the second switch at a first tap point; and the third inductor is coupled to the third switch at a second tap point, wherein the first inductor, second inductor, and third inductor are connected in series, and wherein the first tap point is between the first inductor and the second inductor and the second tap point is between the second inductor and the third inductor.

4. The tunable RF LNA circuit of claim 3, wherein the programmable inductance network further comprises a fourth switch, wherein:

the fourth switch is coupled between the third inductor and ground.

5. The tunable RF LNA circuit of claim 1, wherein a capacitance of the programmable capacitor network is digitally programmable by actuating the first switch.

6. The tunable RF LNA circuit of claim 1, further comprising a control circuit configured to provide control signals to the first switch and the second switch, wherein the control signals actuate a respective switch.

7. The tunable RF LNA circuit of claim 6, wherein the control circuit is further configured to provide control signals to the digitally programmable bias circuit to adjust a value of the reference voltage.

8. The tunable RF LNA circuit of claim 2, wherein the RF receiver is tunable over a range of RX bands comprising a plurality of frequencies, and wherein an effective parallel resistance of the RF receiver is substantially constant over the range of RX bands by adjusting the gate-to-source capacitance, the transconductance of the input transconductor transistor, and the degeneration inductance of the programmable inductance network.

9. The tunable RF LNA circuit of claim 8, wherein the effective parallel resistance of the RF receiver is substantially constant over the range of RX bands when effective parallel resistance of the RF receiver varies less than 20% from a target parallel resistance over the range of RX bands.

10. The tunable RF LNA circuit of claim 2, wherein the RF receiver is tunable over a range of RX bands comprising a plurality of frequencies, and wherein a gain of the RF receiver is substantially constant over the range of RX bands by adjusting the gate-to-source capacitance, the transconductance of the input transconductor transistor and the degeneration inductance of the programmable inductance network.

11. A method for tuning a tunable radio frequency (RF) low noise amplifier (LNA) circuit comprising an amplifier circuit configured to receive an input RF signal from an RF input source and provide an amplified output RF signal, a bias resistor comprising a first end of the bias resistor operatively coupled to an input of the amplifier circuit, a digitally programmable bias circuit operatively coupled to a second end of the bias resistor, and a programmable input impedance circuit operatively coupled between the first end of the bias resistor and ground, the method comprising:

for a target frequency of a plurality of frequencies of the RF LNA, selecting a degeneration inductance, a gate-to-source capacitance, and a transconductance of an input transconductor transistor to yield a target parallel resistance value, wherein selecting the degeneration inductance comprises:

selecting a degeneration inductance value of a programmable inductance network of the programmable input impedance circuit comprising at least a first inductor coupled to a second switch, wherein selecting the inductance comprises actuating at least the second switch, and wherein selecting the transconductance comprises:

selecting a reference current of the programmable bias circuit, wherein the reference current of the digitally programmable bias circuit is mirrored to the input transconductance transistor, and wherein selecting the gate-to-source capacitance comprises selecting a gate-to-source capacitance value of a programmable capacitor network of the programmable input impedance circuit comprising at least a first capacitor coupled to a first switch, wherein selecting the capacitance comprises actuating at least the first switch.

12. The method of claim 11, wherein an operating frequency of a plurality of operating frequencies of the LNA is varied by selecting a capacitance value of the programmable capacitor network.

13. The method of claim 11, wherein the degeneration inductance of the programmable inductance network is digitally programmable using the second switch operatively connected to the first inductor.

14. The method of claim 11, wherein the programmable inductance network further comprises a second inductor and a third inductor, and a third switch, wherein:

the second inductor is coupled to the second switch at a first tap point; and the third inductor coupled to the third switch at a second tap point, wherein the first inductor, second inductor, and third inductor are connected in series, and wherein the first tap point is between the first inductor and the second inductor and the second tap point is between the second inductor and the third inductor.

15. The method of claim 14, wherein the programmable inductance network further comprises a fourth switch, wherein:

the fourth switch is coupled between the third inductor and ground.

16. The method of claim 11, further comprising a control circuit configured to provide control signals to the first switch and the second switch, wherein the control signals actuate a respective switch.

17. The method of claim 16, wherein the control circuit is further configured to provide control signals to the digitally programmable bias circuit to adjust a value of the reference current.

18. The method of claim 16, wherein the control circuit is further configured to provide control signals to adjust the transconductance of the input transconductor transistor.

19. The method of claim 11, wherein the RF LNA is tunable over a range of RX bands comprising a plurality of frequencies, and wherein an effective parallel resistance of the RF receiver is substantially constant over the range of RX bands by adjusting the gate-to-source capacitance, the transconductance of the input transconductor transistor, and the degeneration inductance of the programmable inductance network.

20. The method of claim 11, wherein the RF LNA is tunable over a range of RX bands comprising a plurality of frequencies, and wherein a gain of the RF receiver is substantially constant over the range of RX bands by adjusting the gate-to-source capacitance, the transconductance of the input transconductor transistor, and the degeneration inductance of the programmable inductance network.

* * * * *